United States Patent
Lee et al.

(10) Patent No.: US 9,524,795 B2
(45) Date of Patent: Dec. 20, 2016

(54) ONE-TIME PROGRAMMABLE (OTP) MEMORY CELL AND OTP MEMORY DEVICE FOR MULTI-BIT PROGRAM

(71) Applicants: Joon-Hyung Lee, Seoul (KR); Oh-Kyum Kwon, Suwon-si (KR)

(72) Inventors: Joon-Hyung Lee, Seoul (KR); Oh-Kyum Kwon, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/847,160

(22) Filed: Sep. 8, 2015

(65) Prior Publication Data

US 2016/0148705 A1    May 26, 2016

(30) Foreign Application Priority Data

Nov. 26, 2014  (KR) ........................ 10-2014-0166012

(51) Int. Cl.
    *G11C 17/16*    (2006.01)
    *G11C 17/18*    (2006.01)
(52) U.S. Cl.
    CPC ............... *G11C 17/18* (2013.01); *G11C 17/16* (2013.01)
(58) Field of Classification Search
    USPC .......................................................... 365/96
    See application file for complete search history.

(56) References Cited

U.S. PATENT DOCUMENTS

| 8,817,563 B2 | 8/2014 | Chung |
| 2007/0133269 A1 | 6/2007 | Lee et al. |
| 2008/0157125 A1 | 7/2008 | Kim et al. |
| 2013/0077377 A1 | 3/2013 | Kim |
| 2013/0201746 A1 | 8/2013 | Chung |
| 2013/0201773 A1 | 8/2013 | Kim |
| 2014/0104921 A1 | 4/2014 | Yu et al. |

FOREIGN PATENT DOCUMENTS

| KR | 10-0773398 B1 | 11/2007 |
| KR | 2009-0110524 A | 10/2009 |
| KR | 10-1210286 B1 | 12/2012 |
| KR | 2013-0090714 A | 8/2013 |

*Primary Examiner* — Hoai V Ho
*Assistant Examiner* — Minh Dinh
(74) *Attorney, Agent, or Firm* — Harness, Dickey & Pierce, P.L.C.

(57) ABSTRACT

A one-time programmable (OTP) memory device includes a memory cell array including a plurality of OTP memory cells, the plurality of OTP memory cells being connected to a plurality of bitlines, a plurality of voltage wordlines and a plurality of read wordlines, respectively; and a switching circuit configured to, in a program mode, detect program states of the plurality of OTP memory cells to block currents from flowing through the plurality of OTP memory cells from the voltage wordlines to the bitlines based on the detected program states.

20 Claims, 18 Drawing Sheets

ONE-TIME PROGRAMMABLE (OTP) MEMORY CELL AND OTP MEMORY DEVICE FOR MULTI-BIT PROGRAM

CROSS-REFERENCE TO RELATED APPLICATION

This U.S. Non-provisional application claims priority under 35 USC §119 to Korean Patent Application No. 10-2014-0166012, filed on Nov. 26, 2014, in the Korean Intellectual Property Office (KIPO), the entire disclosure of which is incorporated herein by reference in its.

BACKGROUND

1. Technical Field

Example embodiments relate generally to semiconductor integrated circuits, and more particularly to a one-time programmable (OTP) memory cell and an OTP memory device for multi-bit program.

2. Discussion of the Related Art

Among memory devices for storing data, non-volatile memory devices may retain the stored data even if the power to the memory device is off. For example, the non-volatile memory devices may include read only memory (ROM), a magnetic memory, optical memory, flash memory, etc. Particularly the non-volatile memory that cannot change the stored data once the data are written or programmed in the non-volatile memory may be referred to as a one-time programmable (OTP) memory. After the data are programmed in the OTP memory cell, the structure of the OTP memory cell is changed irreversibly and the data '0' or '1' may be stored in the OTP memory cell using the reversible structure. The OTP memory device may be used variously as an embedded non-volatile storage for storing information on repair of other devices, analog trimming, security codes, etc.

SUMMARY

Programming a one-time programmable (OTP) memory may require relatively high voltage and relatively long program time. Accordingly, it may be desirable to reduce the side effect due to the high voltage and reduce the program time.

At least one example embodiment of the inventive concepts provides an OTP memory cell capable of performing multi-bit program efficiently. At least one example embodiment of the inventive concepts provides an OTP memory device capable of performing multi-bit program efficiently.

According to at least one example embodiment of the inventive concepts, a one-time programmable (OTP) memory device includes a memory cell array including a plurality of OTP memory cells, the plurality of OTP memory cells being connected to a plurality of bitlines, a plurality of voltage wordlines and a plurality of read wordlines, respectively; and a switching circuit configured to, in a program mode, detect program states of the plurality of OTP memory cells to block currents from flowing through the plurality of OTP memory cells from the voltage wordlines to the bitlines based on the detected program states.

Each OTP memory cell may include an antifuse connected between an intermediate node and a corresponding voltage wordline of the plurality of voltage wordlines; and a read transistor connected between the intermediate node and a corresponding bitline of the plurality of bitlines, a gate electrode of the read transistor connected to a corresponding read wordline of the plurality of read wordlines.

The switching circuit may include a plurality of cell switching transistors corresponding to the OTP memory cells, respectively, and each cell switching transistor may be connected between the gate electrode of the read transistor of the corresponding OTP memory cell and a ground voltage, and a gate electrode of each cell switching transistor may be connected to a source electrode of the read transistor of the corresponding OTP memory cell.

The OTP memory device may be configured to turn on the read transistor to program the antifuse in the program mode, and the OTP memory device may be configured to turn on the cell switching transistor in order to turn off the read transistor after the antifuse is programmed and to block a current from flowing through the programmed antifuse from the corresponding voltage wordline to the corresponding bitline.

The OTP memory device may be configured such that, a program voltage is applied to the voltage wordlines in the program mode, and a read voltage lower than the program voltage is applied to the voltage wordlines in a read mode.

The OTP memory device may be configured to set the program voltage to be higher than a threshold voltage of the cell switching transistor.

The OTP memory device may be configured to set the read voltage is set to be lower than a threshold voltage of the cell switching transistor.

The OTP memory device may be configured such that, in the program mode, a program permission voltage is applied to the bitlines connected to the OTP memory cells to be programmed, and a program inhibition voltage higher than the program permission voltage is applied to the bitlines connected to the OTP memory cells not to be programmed.

The OTP memory device may be configured to set the program inhibition voltage is set to be lower than a threshold voltage of the cell switching transistor.

The switching circuit may include a plurality of line switching transistors corresponding to the plurality of bitlines, respectively, each line switching transistor may be connected between the read wordlines and a ground voltage, and a gate electrode of each line switching transistor may be connected to the corresponding bitline.

The two or more line switching transistors may be connected to the plurality of bitlines, respectively.

The antifuse may include a metal oxide semiconductor (MOS) transistor.

A drain electrode of the MOS transistor may be floated, a source electrode of the MOS transistor may be connected to the intermediate node and a gate electrode of the MOS transistor may be connected to the corresponding voltage wordline.

A drain electrode and a source electrode of the MOS transistor may be connected to the intermediate node, and a gate electrode of the MOS transistor may be connected to the corresponding voltage wordline.

According to at least one example embodiment of the inventive concepts, a one-time programmable (OTP) memory device may include a memory cell array including a plurality of OTP memory cells that are connected to a plurality of bitlines, a plurality of voltage wordlines and a plurality of read wordlines, respectively, the OTP memory cells being divided into a plurality of memory banks; and a plurality of bank switching circuits corresponding to the plurality of memory banks, respectively, the plurality of bank switching circuits configured to, in a program mode, detect program states of the OTP memory cells to block currents from flowing through the OTP memory cells from the voltage wordlines to the bitlines based on the detected program states.

Each OTP memory cell may include an antifuse connected between a corresponding voltage wordline of the plurality of voltage wordlines and an intermediate node; and a read transistor connected between the intermediate node and a corresponding bitline of the plurality of bitlines, a gate electrode of the read transistor connected to a corresponding read wordline of the plurality of read wordlines.

The bank switching circuits may include a plurality of cell switching transistors corresponding to the OTP memory cells, respectively, each cell switching transistor of the plurality of cell switching transistors may be connected between the gate electrode of the read transistor of the corresponding OTP memory cell and a ground voltage, and a gate electrode of each cell switching transistor may be connected to a source electrode of the read transistor of the corresponding OTP memory cell.

The bank switching circuits may include a plurality of line switching transistors corresponding to the bitlines, respectively, each line switching transistor may be connected between the read wordlines and a ground voltage, and a gate electrode of each line switching transistor may be connected to the corresponding bitline.

The OTP memory device may be configured to program a plurality of bits in the memory banks simultaneously in the program mode.

According to at least some example embodiments of the inventive concepts, a one-time programmable (OTP) memory cell includes an antifuse connected between a voltage wordline and an intermediate node; a read transistor connected between the intermediate node and a bitline, a gate electrode of the read transistor connected to a read wordline; and a cell switching transistor connected between the gate electrode of the read transistor and a ground voltage, a gate electrode of the cell switching transistor connected to a source electrode of the read transistor, the cell switching transistor configured to, in a program mode, detect a program state of the antifuse to block a current from flowing through the antifuse from the voltage wordline to the bitline based on the detected program state.

According to at least some example embodiments, a one-time programmable (OTP) memory cell includes an antifuse connected between a voltage wordline and an intermediate node such that a first current passes through the antifuse from the voltage wordline to the intermediate node when the antifuse is programmed; a read transistor connected between the intermediate node and a bitline, the read transistor being configured to pass the first current between the intermediate node and the bitline when the read transistor is turned on, the read transistor being configured to block the first current from passing to the bitline when the read transistor is turned off; and a cell switching transistor connected between a gate electrode of the read transistor and a ground node, a gate electrode of the cell switching transistor being connected to the bit line, the cell switching transistor being configured to turn the read transistor off by passing a second current between the gate electrode of the read transistor and the ground node, when the cell switching transistor detects the first current.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
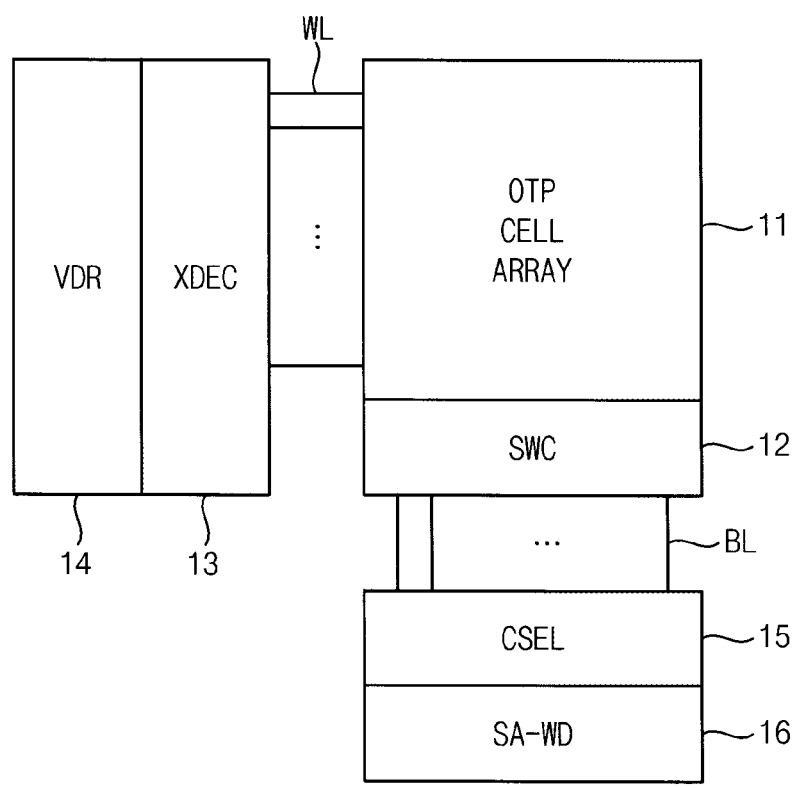
FIG. 1 is a block diagram illustrating a one-time programmable (OTP) memory device according to at least some example embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a one-time programmable (OTP) memory device according to at least some example embodiments of the inventive concepts.

Referring to FIG. 1, an OTP memory device 10 includes a memory cell array 11, a switching circuit SWC 12, row selection circuits VDR (i.e., voltage driver) 14 and XDEC (i.e., row decoder) 13, a column selection circuit CSEL 15 and a read-write circuit SA-WD 16. According to at least some example embodiments, the OTP memory device 10 may also include a control logic that controls the operations of the memory device 10 including any or all of the operations described herein with respect to of the OTP memory device 10, memory cell array 11, switching circuit SWC 12, VDR 14 XDEC 13, column selection circuit CSEL 15 and read-write circuit SA-WD 16. The control logic included in the memory device 10 may be implemented as a circuit, as one or more programs (e.g., software/firmware) or a combination of circuitry and software. For example the control logic of the memory device 10 may be a processor. According to at least some alternative example embodiments, the operations of the OTP device 10 may be controlled by an external device. The term 'processor', as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multi-core processor; a multi-processor, an application-specific integrated circuit (ASIC), and a field programmable gate array (FPGA).

The memory cell array 11 may include a plurality of OTP memory cells that are coupled to a plurality of bitlines BL and a plurality of wordlines WL, respectively. As will be described with reference to FIG. 2, the wordlines WL may include voltage wordlines WLP and read wordlines WLR.

The switching circuit 12 may, in a program mode, detect program states of the OTP memory cells to block currents from flowing through the OTP memory cells from the voltage wordlines WLP to the bitlines BL based on the detected program states.

Even though FIG. 1 illustrates the memory cell array 11 and switching circuit 12 distinctively, the switching circuit 12 may be included in the memory cell array 11.

According to at least some example embodiments of the inventive concepts, as will be described below with reference to FIG. 9, the switching circuit 12 may be inseparably formed with the memory cell array 11. For example, the switching circuit 12 may include a plurality of cell switching transistors CTS corresponding to the OTP memory cells, respectively. Each cell switching transistor CTS may be connected between a gate electrode of a read transistor TR of the corresponding OTP memory cell and a ground voltage and a gate electrode of each cell switching transistor may be connected to a source electrode of the read transistor TR of the corresponding OTP memory cell.

According to at least some other example embodiments of the inventive concepts, as will be described below with reference to FIGS. 11 and 12, the switching circuit 12 may be formed separably from the memory cell array 11. For example, the switching circuit 12 may include a plurality of line switching transistors LTS corresponding to the bitlines BL, respectively. Each line switching transistor LTS may be connected between the read wordlines WLR and a ground voltage and a gate electrode of each line switching transistor LTS may be connected to the corresponding bitline BL.

The row selection circuits 13 and 14 may include a row decoder 13 for selecting a wordline WL corresponding to a row address and a voltage driver 14 which is a circuit for providing the various voltages described herein as being applied to the wordlines WL. The voltages applied to the wordlines WL by the voltage driver 14 may include, for example, a program voltage VPGM, a read voltage VRD, etc. as will be described below with reference to FIG. 3.

The column selection circuit 15 may include a column gate circuit and a column decoder for selecting a bitline corresponding to a column address. The column decoder may generate column selection signals based on the column address and a column selection enable signal. The column gate circuit may include a plurality of switches that are turned on selectively in response to the column selection signals. The one switch corresponding to the column address may be turned on to select the bitline BL.

The read-write circuit 16 may be connected to the bitlines BL via the column selection circuit 15. The read-write circuit 16 may include a read sense amplifier SA and a write driver WD. The read sense amplifier SA may perform a read operation for sensing the data stored in the OTP memory cells and providing the read data. The write driver WD may perform a write operation for storing the write data into the OTP memory cells. The write driver WD and the read sense amplifier SA may be formed inseparably or separably. The read-write circuit 16 (e.g., using the write driver) may provide the various voltages described herein as being applied to the bit lines BL.

Hereinafter, example embodiments of the memory cell array 11 and the switching circuit 12 are described with reference to FIGS. 2 through 12. The row selection circuits 13 and 14, the column selection circuit 15 and the read-write circuit 16 may have various configurations conforming to the example embodiments of the memory cell array 11 and the switching circuit 12.

Figure 2:
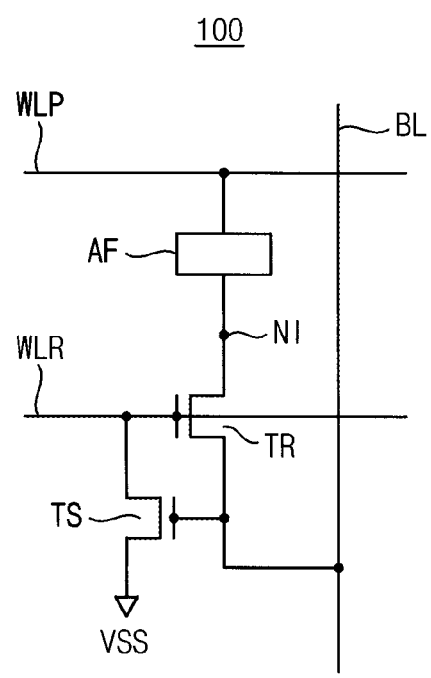
FIG. 2 is a circuit diagram illustrating an OTP memory cell according to at least some example embodiments of the inventive concepts.

FIG. 2 is a circuit diagram illustrating an OTP memory cell according to at least some example embodiments of the inventive concepts.

Referring to FIG. 2, an OTP memory cell 100 may include an antifuse AF, a read transistor TR and a switching transistor TS.

The antifuse AF may be connected between a corresponding voltage wordline WLP and an intermediate node NI. The antifuse AF may be implemented with a metal oxide semiconductor (MOS) transistor. According to at least one example embodiment of the inventive concepts, as will be described with reference to FIG. 4, a drain electrode of the MOS transistor may be floated, a source electrode of the MOS transistor may be connected to the intermediate node NI and a gate electrode of the MOS transistor may be connected to the corresponding voltage wordline WLP. In at least another example embodiment of the inventive concepts, as will be described with reference to FIG. 7, the drain electrode and the source electrode of the MOS transistor may be connected to the intermediate node NI and the gate electrode of the MOS transistor may be connected to the corresponding voltage wordline WLP.

The antifuse AF, which is an example element of the OTP memory cell, may have an electrical feature opposite to a typical fuse such that the antifuse AF has a higher resistance value in an unprogrammed state and a lower resistance value in a programmed state. The antifuse AF may have a structure such that dielectric material is inserted between two conductors. The dielectric material may be broken and programmed by applying a high voltage between the two conductors for a sufficient time. As a result of the program, the two conductors are electrically connected through the broken dielectric material and thus the antifuse AF may have the lower resistance value. As one of the antifuse type OTP memory, the MOS capacitor having a thin gate oxide may be used as the antifuse AF and the high voltage may be applied between the two electrodes of the MOS capacitor to program the MOS capacitor. The OTP memory cell using the MOS capacitor may have a smaller cell area and a lower program current, and thus intellectual properties of low power may be implemented and program by unit of byte may be performed.

The read transistor TR may be connected between the intermediate node NI and a corresponding bitline BL, and a gate electrode of the read transistor TR may be connected to a corresponding read wordline WLR. The switching transistor TS may be connected between the gate electrode of the read transistor TR and a ground voltage VSS, and a gate electrode of the switching transistor TS may be connected to a source electrode of the read transistor TR.

The switching transistor TS may, in a program mode, detect a program state of the antifuse AF to block a current from flowing through the antifuse AF from the voltage wordline WLP to the bitline BL based on the detected program state.

Figure 3:
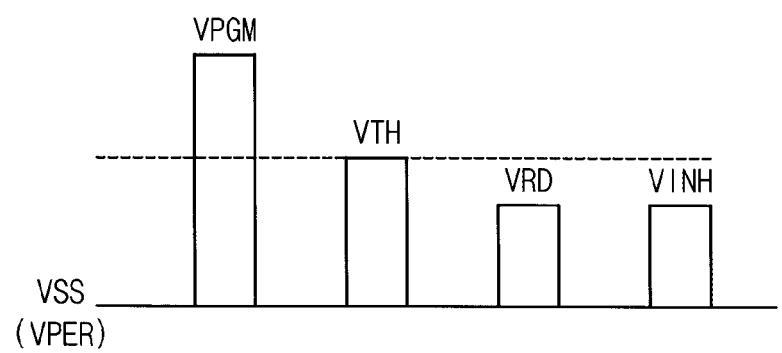
FIG. 3 is a diagram illustrating relations between operational voltages and a threshold voltage of an OTP memory cell according to at least some example embodiments of the inventive concepts.

FIG. 3 is a diagram illustrating relations between operational voltages and a threshold voltage of an OTP memory cell according to at least some example embodiments of the inventive concepts.

Referring to FIGS. 2 and 3, a program voltage VPGM of relatively a high voltage level may be applied to the voltage wordline WLP in a program mode and read voltage VRD having a lower voltage level than the program voltage VPGM may be applied to the voltage wordline WLP in a read mode. A selection voltage having a voltage level enough to turn on the read transistor TR may be applied to the read wordline WLR in the program and read modes.

In the program mode, a program permission voltage VPER may be applied to the bitlines connected to the OTP memory cells to be programmed, and a program inhibition voltage VINH higher than the program permission voltage VPER may be applied to the bitlines connected to the OTP memory cells not to be programmed. For example, the program permission voltage VPER may be set to the ground voltage VSS, and/or the program inhibition voltage VINH and the read voltage VRD may be set to the power supply voltage. The voltage levels of the program voltage VPGM, the read voltage VRD, the program permission voltage VPER and the program inhibition voltage VINH may be set variously depending on the characteristics of the OTP memory cells and the configuration of the OTP memory device.

The program of the antifuse AF may be performed in the program mode such that the program voltage VPGM is applied to the voltage wordline WLP, the selection voltage is applied to the read wordline WLR to turn on the read transistor TR and the program permission voltage VPER is applied to the bitline BL. According to at least some example embodiments of the inventive concepts, the program voltage applied to the voltage wordline WLP in the program mode may be set to be higher than a threshold voltage VTH of the switching transistor TS. The program voltage VPGM applied to the voltage wordline WLP may be transferred to the gate electrode of the switching transistor TS after the antifuse AF is programmed, and then the switching transistor TS may be turned on. As a result, just after the antifuse AF is programmed, the read transistor TR may be turned off to block the current from flowing through the programmed antifuse AF from the voltage wordline WLP to the bitline BL.

The read voltage VRD applied to the voltage wordline WLP in the read mode may be set to be lower than the threshold voltage VTH of the switching transistor TS. The programmed state or the unprogrammed state of the antifuse AF may be detected by sensing the voltage on the bitline BL that is changed depending on the state of the antifuse AF. The read voltage VRD may be set to be lower than the threshold voltage VTH to secure the normal read operation by preventing the read transistor TR from being turned off by the switching transistor TS in the read mode.

In addition, the program inhibition voltage VINH applied to the bitline BL in the read mode may be set to be lower than the threshold voltage VTH of the switching transistor TS. As described above, the programmed state or the unprogrammed state of the antifuse AF may be detected by sensing the voltage on the bitline BL that is changed depending on the state of the antifuse AF. The program inhibition voltage VINH may be set to be lower than the threshold voltage VTH of the switching transistor TS to secure the normal read operation by preventing the read transistor TR from being turned off by the switching transistor TS in the read mode.

Figure 4:
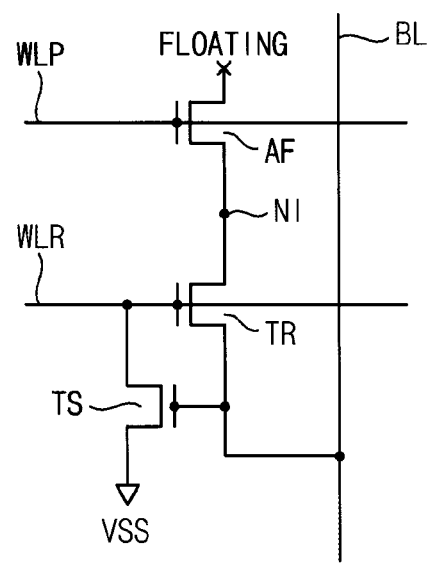
FIG. 4 is a circuit diagram illustrating an OTP memory cell according to at least one example embodiment of the inventive concepts.

FIG. 4 is a circuit diagram illustrating an OTP memory cell according to at least one example embodiment of the inventive concepts.

Referring to FIG. 4, an OTP memory cell 101 may include an antifuse AF, a read transistor TR and a switching transistor TS.

The antifuse AF may be connected between a corresponding voltage wordline WLP and an intermediate node NI. As illustrated in FIG. 4, the antifuse AF may be implemented with a metal oxide semiconductor (MOS) transistor. A drain electrode of the MOS transistor AF may be floated, a source electrode of the MOS transistor AF may be connected to the intermediate node NI and a gate electrode of the MOS transistor AF may be connected to the voltage wordline WLP.

The read transistor TR may be connected between the intermediate node NI and a corresponding bitline BL, and a gate electrode of the read transistor TR may be connected to a corresponding read wordline WLR. The switching transistor TS may be connected between the gate electrode of the read transistor TR and a ground voltage VSS, and a gate electrode of the switching transistor TS may be connected to a source electrode of the read transistor TR.

The switching transistor TS may, in a program mode, detect a program state of the MOS transistor AF to block a current from flowing through the MOS transistor AF from the voltage wordline WLP to the bitline BL based on the detected program state.

Figure 5:
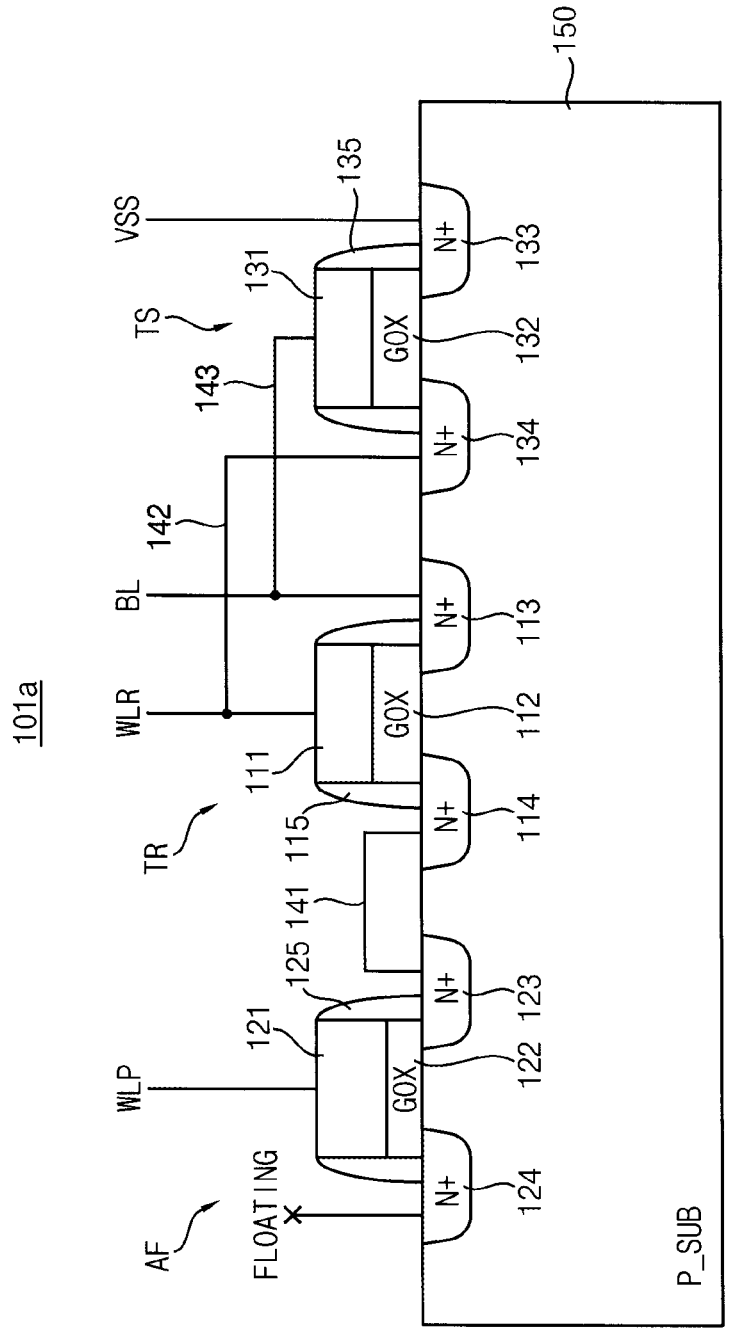
FIG. 5 is a cross-sectional diagram illustrating an example structure of the OTP cell of FIG. 4.

FIG. 5 is a cross-sectional diagram illustrating an example structure of the OTP cell of FIG. 4.

Referring to FIG. 5, a memory cell 101a may include an antifuse AF, a read transistor TR and a switching transistor TS that are formed on a same substrate P-SUB 150.

The read transistor TR may include a first gate 111 connected to a corresponding read wordline WLR, a first gate insulation layer GOX 112 insulating the first gate 111 from the substrate 150, a first source region 113 connected to a corresponding bitline BL and a first drain region 114.

The antifuse AF may include a second gate 121 connected to a corresponding voltage wordline WLP, a second gate insulation layer 122 insulating the second gate 121 from the substrate 150, a second source region 123 connected to the first drain region 114 of the read transistor TR and a second drain region 124 that is floated.

The switching transistor TS may include a third gate 131 connected to the first source region 113 of the read transistor TR, a third gate insulation layer 132 insulating the third gate 131 from the substrate 150, a third source region 133 connected to a ground voltage VSS and a third drain region 134 connected to the first gate 111 of the read transistor TR.

The second source region 123 of the antifuse AF may be electrically connected to the first drain region 114 of the read transistor TR by a conduction path 141. The third drain region 134 of the switching transistor TS may be electrically connected to the first gate 111 of the read transistor TR by a conduction path 142. The third gate 131 of the switching transistor TS may be electrically connected to the first source region 113 of the read transistor TR by a conduction path 143. The conduction paths 141, 142 and 143 may include metal lines formed in an upper space and interlayer structure such as vias for connecting the metal lines to the upper surface of the substrate 150.

For example, the substrate 150 may be doped with P-type impurities, and the source regions 113, 123 and 133 and the drain regions 114, 124 and 134 may be doped with N-type impurities.

The read transistor TR may further include a first spacer 115 formed on sidewalls of the first gate 111 and the first gate insulation layer 112. The antifuse AF may further include a second spacer 125 formed on sidewalls of the second gate 121 and the second gate insulation layer 122. The switching transistor TS may further include a third spacer 135 formed on sidewalls of the third gate 131 and the third gate insulation layer 132.

Hereinafter, processes of manufacturing the OTP memory cell 101a are described briefly.

The first gate insulation layer 112, the second gate insulation layer 122 and the third insulation layer 132 may be formed on the substrate 150. The first gate 111 may be formed on the first gate insulation layer 112, the second gate 121 may be formed on the second gate insulation layer 122 and the third gate 131 may be formed on the third gate insulation layer 132. The source regions 113, 123 and 133 and the drain regions 114, 124 and 134 may be formed by an ion implantation process, which implants N-type impurities into both sides of the first gate 111, the second gate 121 and the third gate 131. After that, the spacers 115, 125 and 135 and the conduction paths 141, 142 and 143 may be formed.

As illustrated in FIG. 5, the first gate insulation layer 112 of the read transistor TR and the third gate insulation layer 132 of the switching transistor TS may be formed to be thicker than the second gate insulation layer 122 of the antifuse AF.

In a general MOS transistor, if a voltage of a drain region is higher than a voltage of a gate, a strong electric field may be applied to portions of a gate insulation layer in which the gate and the drain region overlaps. In this case, a deep depletion area may be formed in the drain region and an energy band may bend sharply so that band-to-band tunneling or trap-assisted tunneling of an electron increases. Therefore, a leakage current, that is referred to as a gate-induced drain leakage (GIDL) current, may occur in the drain region. As the voltage of the drain region is higher than the voltage of the gate, the GIDL current increases. A program disturbance may be caused by the GIDL current such that also the antifuse in a non-selected memory cell is programmed. The GIDL current and the program disturbance may be reduced by increasing the thickness of the first gate insulation layer 112 to decrease the electric field formed in the first gate insulation layer 112.

Figure 6:
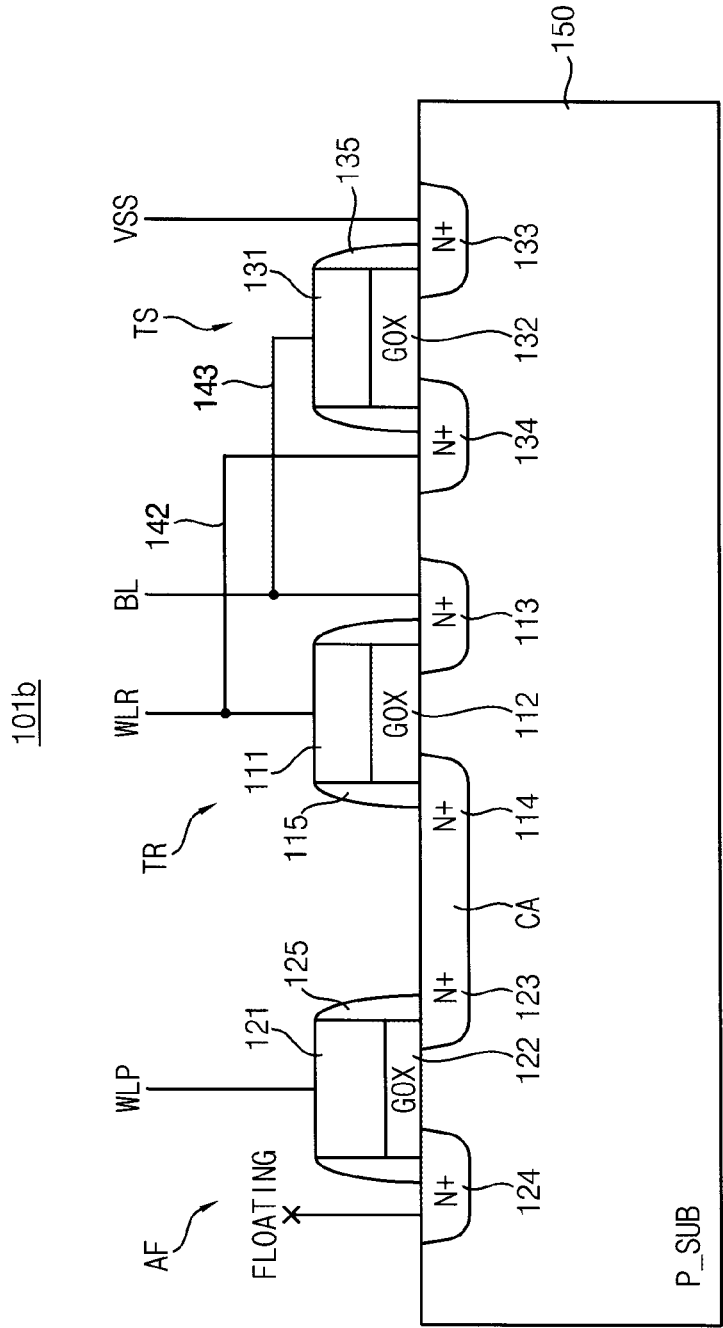
FIG. 6 is a cross-sectional diagram illustrating another example structure of the OTP cell of FIG. 4.

FIG. 6 is a cross-sectional diagram illustrating another example structure of the OTP cell of FIG. 4.

Referring to FIG. 6, a memory cell 101b may include an antifuse AF, a read transistor TR and a switching transistor TS that are formed on a same substrate P-SUB 150.

In comparison with the OTP memory cell 101a of FIG. 5, the second source region 123 of the antifuse AF and the first drain region 114 of the read transistor TR share an impurity region CA in the OTP memory cell 101b of FIG. 6. Accordingly the conduction path 141 in FIG. 5 for connecting the second source region 123 and the first drain region 114 may be omitted.

The read transistor TR may include a first gate 111 connected to a corresponding read wordline WLR, a first gate insulation layer GOX 112 insulating the first gate 111 from the substrate 150, a first source region 113 connected to a corresponding bitline BL and a first drain region 114.

The antifuse AF may include a second gate 121 connected to a corresponding voltage wordline WLP, a second gate insulation layer 122 insulating the second gate 121 from the substrate 150, a second source region 123 connected to the first drain region 114 of the read transistor TR and a second drain region 124 that is floated.

The switching transistor TS may include a third gate 131 connected to the first source region 113 of the read transistor TR, a third gate insulation layer 132 insulating the third gate 131 from the substrate 150, a third source region 133 connected to a ground voltage VSS and a third drain region 134 connected to the first gate 111 of the read transistor TR.

The second source region 123 of the antifuse AF and the first drain region 114 of the read transistor TR may be connected by a common impurity region CA. The third drain region 134 of the switching transistor TS may be electrically connected to the first gate 111 of the read transistor TR by a conduction path 142. The third gate 131 of the switching transistor TS may be electrically connected to the first source region 113 of the read transistor TR by a conduction path 143. The conduction paths 142 and 143 may include metal lines formed in an upper space and interlayer structure such as vias for connecting the metal lines to the upper surface of the substrate 150.

For example, the substrate 150 may be doped with P-type impurities, and the source regions 113, 123 and 133, the drain regions 114, 124 and 134 and the common impurity region CA may be doped with N-type impurities.

The read transistor TR may further include a first spacer 115 formed on sidewalls of the first gate 111 and the first gate insulation layer 112. The antifuse AF may further include a second spacer 125 formed on sidewalls of the second gate 121 and the second gate insulation layer 122. The switching transistor TS may further include a third spacer 135 formed on sidewalls of the third gate 131 and the third gate insulation layer 132.

Hereinafter, processes of manufacturing the OTP memory cell 101a are described briefly.

The first gate insulation layer 112, the second gate insulation layer 122 and the third insulation layer 132 may be formed on the substrate 150. The first gate 111 may be formed on the first gate insulation layer 112, the second gate 121 may be formed on the second gate insulation layer 122 and the third gate 131 may be formed on the third gate insulation layer 132. The source regions 113, 123 and 133 and the drain regions 114, 124 and 134 may be formed by an ion implantation process, which implants N-type impurities into both sides of the first gate 111, the second gate 121 and the third gate 131. At this time, the common impurity region CA may be further formed by opening the mask between the first gate 111 of the read transistor TR and the second gate 121 of the antifuse AF. After that, the spacers 115, 125 and 135 and the conduction paths 141, 142 and 143 may be formed.

Figure 7:
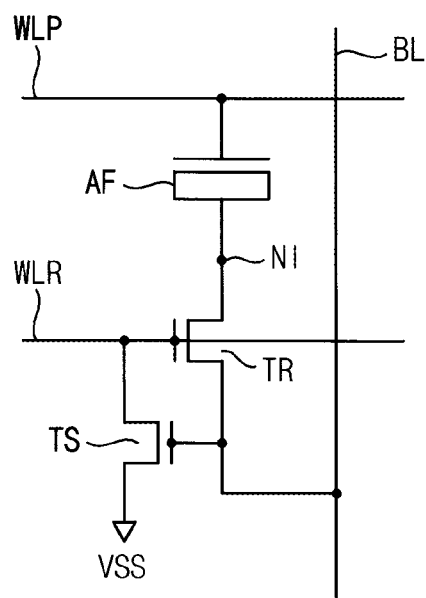
FIG. 7 is a circuit diagram illustrating an OTP memory cell according to at least another example embodiment of the inventive concepts.

FIG. 7 is a circuit diagram illustrating an OTP memory cell according to at least another example embodiment of the inventive concepts.

Referring to FIG. 7, an OTP memory cell 102 may include an antifuse AF, a read transistor TR and a switching transistor TS.

The antifuse AF may be connected between a corresponding voltage wordline WLP and an intermediate node NI. As illustrated in FIG. 7, the antifuse AF may be implemented with a metal oxide semiconductor (MOS) transistor. A drain electrode and a source electrode of the MOS transistor may be connected to the intermediate node NI and the gate electrode of the MOS transistor may be connected to a corresponding voltage wordline WLP.

The read transistor TR may be connected between the intermediate node NI and a corresponding bitline BL, and a gate electrode of the read transistor TR may be connected to a corresponding read wordline WLR. The switching transistor TS may be connected between the gate electrode of the read transistor TR and a ground voltage VSS, and a gate electrode of the switching transistor TS may be connected to a source electrode of the read transistor TR.

The switching transistor TS may, in a program mode, detect a program state of the MOS transistor AF to block a current from flowing through the MOS transistor AF from the voltage wordline WLP to the bitline BL based on the detected program state.

Figure 8:
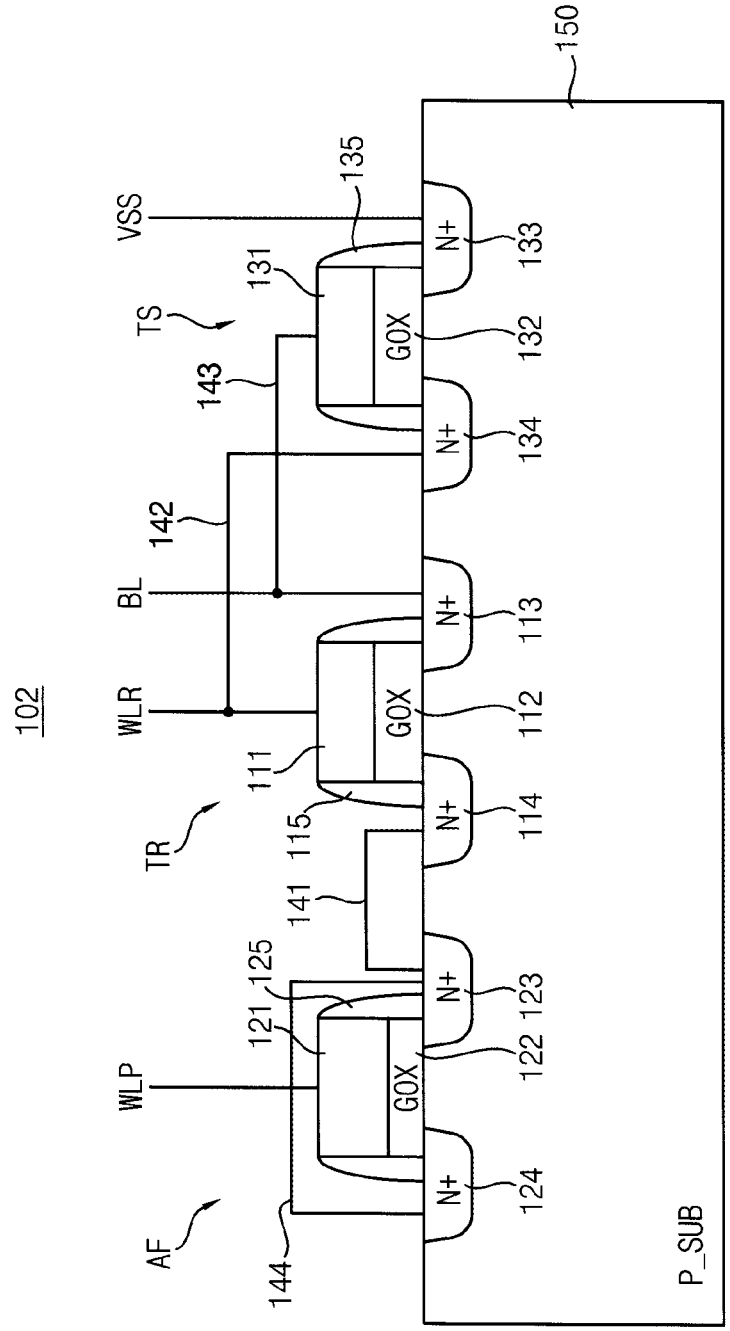
FIG. 8 is a cross-sectional diagram illustrating an example structure of the OTP cell of FIG. 7.

FIG. 8 is a cross-sectional diagram illustrating an example structure of the OTP cell of FIG. 7.

Referring to FIG. 8, a memory cell 102 may include an antifuse AF, a read transistor TR and a switching transistor TS that are formed on a same substrate P-SUB 150.

The read transistor TR may include a first gate 111 connected to a corresponding read wordline WLR, a first gate insulation layer GOX 112 insulating the first gate 111 from the substrate 150, a first source region 113 connected to a corresponding bitline BL and a first drain region 114.

The antifuse AF may include a second gate 121 connected to a corresponding voltage wordline WLP, a second gate insulation layer 122 insulating the second gate 121 from the substrate 150, a second source region 123 connected to the first drain region 114 of the read transistor TR and a second drain region 124.

The switching transistor TS may include a third gate 131 connected to the first source region 113 of the read transistor TR, a third gate insulation layer 132 insulating the third gate 131 from the substrate 150, a third source region 133 connected to a ground voltage VSS and a third drain region 134 connected to the first gate 111 of the read transistor TR.

The second source region 123 of the antifuse AF may be electrically connected to the first drain region 114 of the read transistor TR by a conduction path 141. In addition, the second source region 123 of the antifuse AF may be electrically connected to the second drain region 124 of the antifuse AF by a conduction path 144. The third drain region 134 of the switching transistor TS may be electrically connected to the first gate 111 of the read transistor TR by a conduction path 142. The third gate 131 of the switching transistor TS may be electrically connected to the first source region 113 of the read transistor TR by a conduction path 143. The conduction paths 141, 142, 143 and 144 may include metal lines formed in an upper space and interlayer structure such as vias for connecting the metal lines to the upper surface of the substrate 150.

For example, the substrate 150 may be doped with P-type impurities, and the source regions 113, 123 and 133 and the drain regions 114, 124 and 134 may be doped with N-type impurities.

The read transistor TR may further include a first spacer 115 formed on sidewalls of the first gate 111 and the first gate insulation layer 112. The antifuse AF may further include a second spacer 125 formed on sidewalls of the second gate 121 and the second gate insulation layer 122. The switching transistor TS may further include a third spacer 135 formed on sidewalls of the third gate 131 and the third gate insulation layer 132.

Hereinafter, processes of manufacturing the OTP memory cell 101a are described briefly.

The first gate insulation layer 112, the second gate insulation layer 122 and the third insulation layer 132 may be formed on the substrate 150. The first gate 111 may be formed on the first gate insulation layer 112, the second gate 121 may be formed on the second gate insulation layer 122 and the third gate 131 may be formed on the third gate insulation layer 132. The source regions 113, 123 and 133 and the drain regions 114, 124 and 134 may be formed by an ion implantation process, which implants N-type impurities into both sides of the first gate 111, the second gate 121 and the third gate 131. After that, the spacers 115, 125 and 135 and the conduction paths 141, 142, 143 and 144 may be formed.

Figure 9:
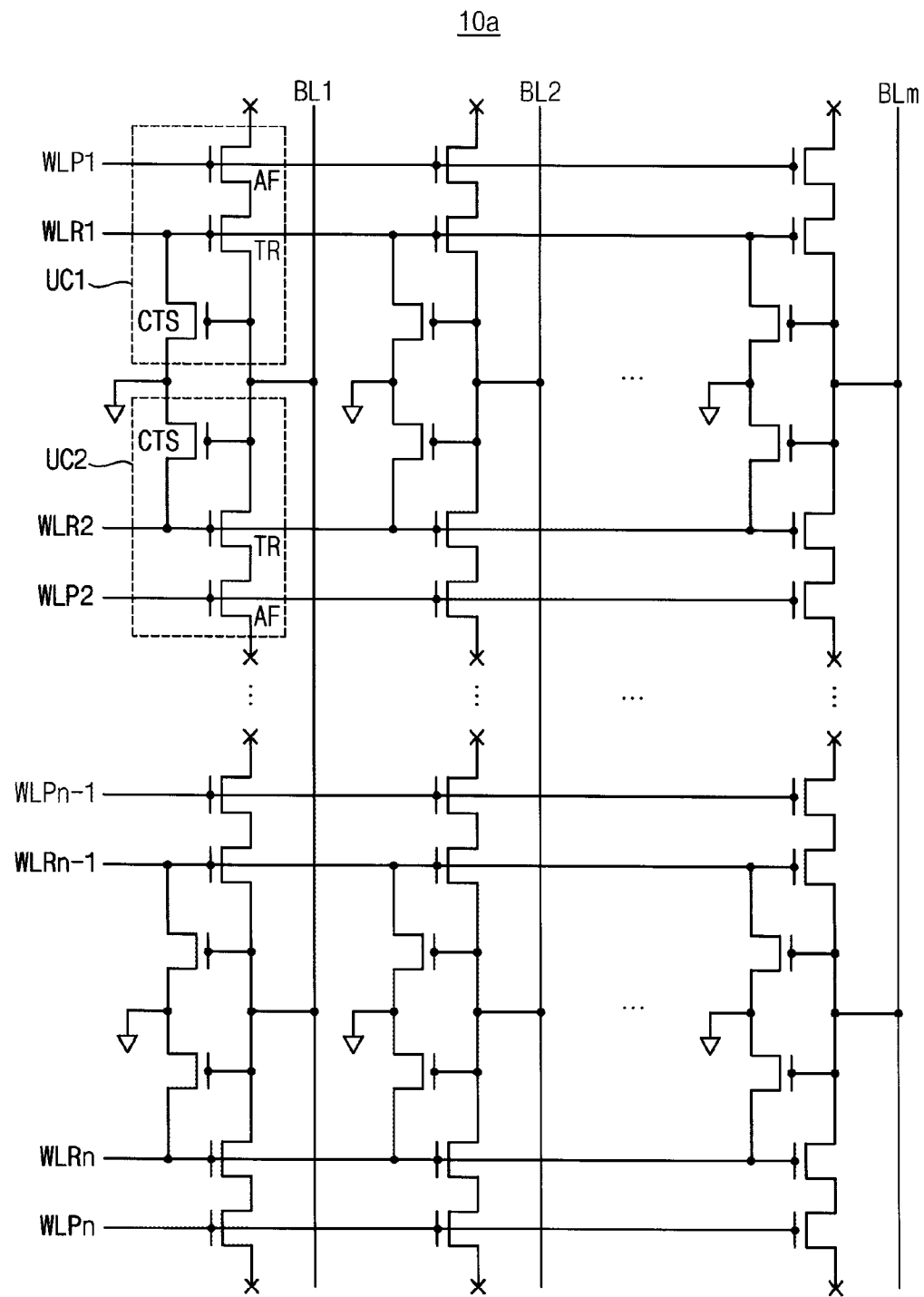
FIG. 9 is a circuit diagram illustrating an OTP memory device according to at least one example embodiment of the inventive concepts.

FIG. 9 is a circuit diagram illustrating an OTP memory device according to at least one example embodiment of the inventive concepts.

FIG. 9 illustrates an OTP memory device 10a in which the switching circuit 12 and the memory cell array 11 in FIG. 1 are formed inseparably. The switching circuit 12 in FIG. 1 may include a plurality of cell switching transistors CTS corresponding to the OTP memory cells, respectively. Each cell switching transistor CTS may be connected between a gate electrode of a read transistor TR of the corresponding OTP memory cell and a ground voltage, and a gate electrode of each cell switching transistor CTS may be connected to a source electrode of the read transistor TR of the corresponding OTP memory cell. Each of unit cells UC1 and UC2 in FIG. 9 may be considered as an OTP memory cell including each cell switching transistor CTS and entire configuration of FIG. 9 may be considered as a memory cell array including the switching circuit 12 in the form of the cell switching transistors CTS.

Referring to FIG. 9, the memory cell array 10a may include a plurality of OTP memory cells UC1 and UC2 that are connected to a plurality of bitlines BL1~BLm, a plurality of voltage wordlines WLP1~WLPn and a plurality of read wordlines WLR1~WLRn, respectively, and arranged in an n*m matrix.

The gate electrode of the read transistor TR may be connected to the corresponding read wordline WLRx (x=1~n) and the source electrode of the read transistor TR may be connected to the corresponding bitline BLy (y=1~m).

The first electrode of the antifuse AF may be connected to the corresponding wordline WLPx and the second electrode of the antifuse AF may be connected to the drain electrode of the read transistor TR.

The cell switching transistor CTS may be connected between the gate electrode of the read transistor TR and the ground voltage, and the gate electrode of the cell switching transistor CTS may be connected to source electrode of the read transistor TR. The cell switching transistor CTS may, in the program mode, detect the program state of the antifuse AF to block the current from flowing through the antifuse AF from the corresponding voltage wordline WLPx to the corresponding bitline BLy based on the detected program state.

As described above, the antifuse AF may be a MOS transistor. The gate electrode or the first electrode of the MOS transistor AF may be connected to the corresponding voltage wordline WLPx, the source electrode or the second electrode of the MOS transistor AF may be connected to the drain electrode of the read transistor TR and the drain electrode of the MOS transistor AF may be floated.

Each of the OTP memory cells UC1 and UC2 may include the antifuse AF, the read transistor TR and the cell switching transistor CTS. FIG. 9 illustrates a non-limiting example that two unit cells UC1 and UC2 form a pair and the arrangement of the unit cells may be implemented variously.

Hereinafter, a programming operation of the OTP memory cell according to example embodiments is described with reference to FIGS. 3, 4, 5 and 9.

In case of programming a selected memory cell, which is connected to a selected voltage wordline WLP1, a selected read wordline WLR1 and a selected bitline BL1, a program voltage VPGM, which is a relatively high voltage, may be applied to the selected voltage wordline WLP1 and a selection voltage, which is lower than the program voltage VPGM, may be applied to the selected read wordline WLR1. A ground voltage 0V may be applied to non-selected voltage wordlines WLP2, . . . , WLPn and non-selected read wordlines WLR2, . . . , WLRn. The program permission voltage VPER (e.g., the ground voltage 0V) may be applied to the selected bitline BL1, and the program inhibition voltage VINH may be applied to non-selected bit lines BL2, . . . , BLm. For example, the program voltage VPGM may be about 7V, and the selection voltage may be about 3V.

The selection voltage may be applied to the first gate 111 of the read transistor TR through the selected read wordline WLR1, and the ground voltage 0V may be applied to the source region 113 of the read transistor TR through the selected bitline BL1. Therefore, the read transistor TR may be turned on and a voltage of the first drain 114 may be 0V. The program voltage VPGM may be applied to the second gate 121 of the antifuse AF through the selected voltage wordline WLP1, and, as described above, the voltage of the second source region 123 of the antifuse AF, may be the ground voltage 0V. Therefore, intensive electric field may be applied to the second gate insulation layer 122 of the antifuse AF1 to break down an insulating property of the second gate insulation layer 122 so that the selected memory cell is programmed.

When the antifuse AF is programmed, the source region 123 of the antifuse AF, all of the drain region 114 and the source region 113 of the read transistor TR are electrically connected, and thus a considerable leakage current may flow from the corresponding voltage wordline to the corresponding bitline BL1. As will be described with reference to FIG. 10, the leakage current may increase the voltage drop along the voltage wordline and disturb the program of the other OTP memory cells connected to the same wordline but connected to the different bitlines.

The non-selected memory cells that are connected to the non-selected voltage wordlines WLP2, . . . , WLPn and the non-selected read wordlines WLR2, . . . , WLRn may not be programmed since the ground voltage 0V is applied to both the non-selected voltage wordlines WLP2, . . . , WLPn and the non-selected read wordlines WLR2 so that intensive electric field is not applied to the second gate insulation layer 122.

The non-selected memory cells that are connected to the selected voltage wordline WLP1, the selected read wordline WLR1 and the non-selected bitlines BL2, . . . , BLm may not be programmed, either.

For example, an operation of the non-selected memory cell, which is connected to the selected voltage wordline WLP1, the selected read wordline WLR1 and the non-selected bit line BL2 may be described. The selection voltage may be applied to the selected read wordline WLR1 and the program inhibition voltage VINH may be applied to the non-selected bitline BL2. A voltage difference between the first gate 111 of the read transistor TR and the first source region 113 of the read transistor TR may be zero so that the read transistor TR is turned off and the first drain region 114 of the read transistor TR is floated. Even though the program voltage VPGM is applied to the second gate 121 of the antifuse AF through the selected voltage wordline WLP1, an intensive electric field may not be applied to the second gate insulation layer 122 of the antifuse AF because the second source region 123 of the antifuse AF is floated.

According to at least some example embodiments of the inventive concepts, the switching transistor TS, that is, the cell switching transistor CTS may detect the programmed state of the OTP memory cell in the program mode and may block the current from flowing through the programmed OTP memory cell from the voltage wordline to the bitline.

When the antifuse AF is programmed, a high voltage corresponding to the program voltage VPGM is applied to the third gate 131 of the switching transistor TS. As described above, the program voltage VPGM may be set to be higher than the threshold voltage VTH of the switching transistor TS. The switching transistor TS may be turned on and the first gate of the read transistor TR may be connected to the ground voltage VSS. As a result, the read transistor TR may be turned off to block the current flowing through the programmed antifuse AF from the voltage wordline WLP to the bitline BL.

As such, the OTP memory cell and the OTP memory device may reduce the voltage drop on the voltage word line using the switching circuit to block the leakage current from flowing through the program-completed antifuse and thus may efficiently perform the multi-bit program of programming multiple bits simultaneously.

Figure 10:
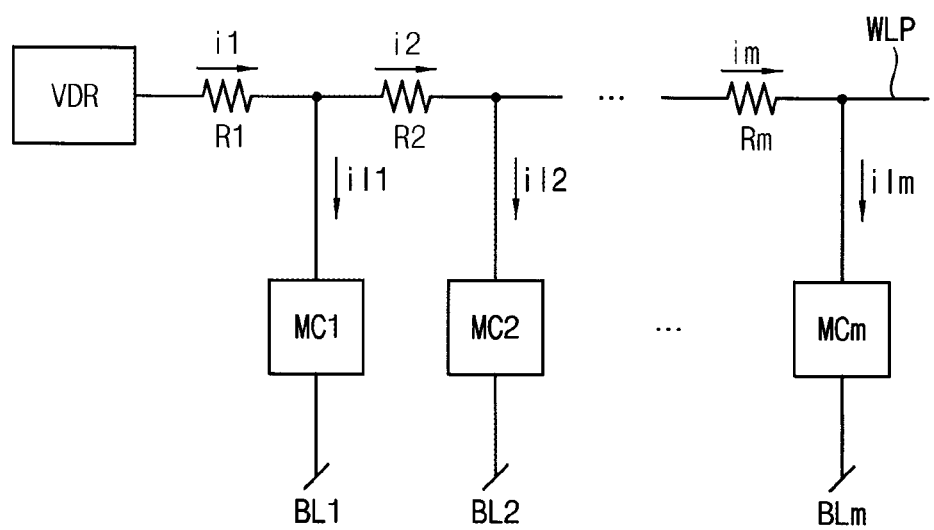
FIG. 10 is a diagram for describing a voltage drop in multi-bit program.

FIG. 10 is a diagram for describing a voltage drop in multi-bit program.

FIG. 10 illustrates one voltage wordline WLP connected to the voltage driver VDR 14 in FIG. 1 and OTP memory cells MC1~MCm connected to the voltage wordline WLP and respective bitlines BL1~BLm. For convenience of illustration and description, the intermediate path such the row decoder between the voltage driver VDR and the voltage wordline WLP is omitted.

Many OTP memory cells are connected to the one voltage wordline WLP and the leakage currents il1~ilm may be caused through the OTP memory cells. The leakage currents il1~ilm may cause the currents i1~im on the voltage wordline WLP, and the voltage drop occurs due to the resistance components R1~Rm of the voltage wordline WLP and the current i1~im. The voltage drop is increased gradually from the voltage driver along the voltage wordline WLP, and the program may be insufficient due to decrease of the program voltage VPGM.

The multi-bit program may be performed such that the program inhibition voltage VINH or the program permission voltage VPER is applied to each of the bitlines depending on the program data or the write data and then the OTP memory cells connected to the same wordline are programmed simultaneously. In this case, the leakage currents through the programmed OTP memory cells may increase sharply and the voltage drop on the voltage wordline WLP may become severe.

According to at least some example embodiments of the inventive concepts, the voltage drop on the voltage word line may be reduced using the switching circuit to block the leakage current flowing through the program-completed antifuse to efficiently perform the multi-bit program of programming multiple bits simultaneously.

Figure 11:
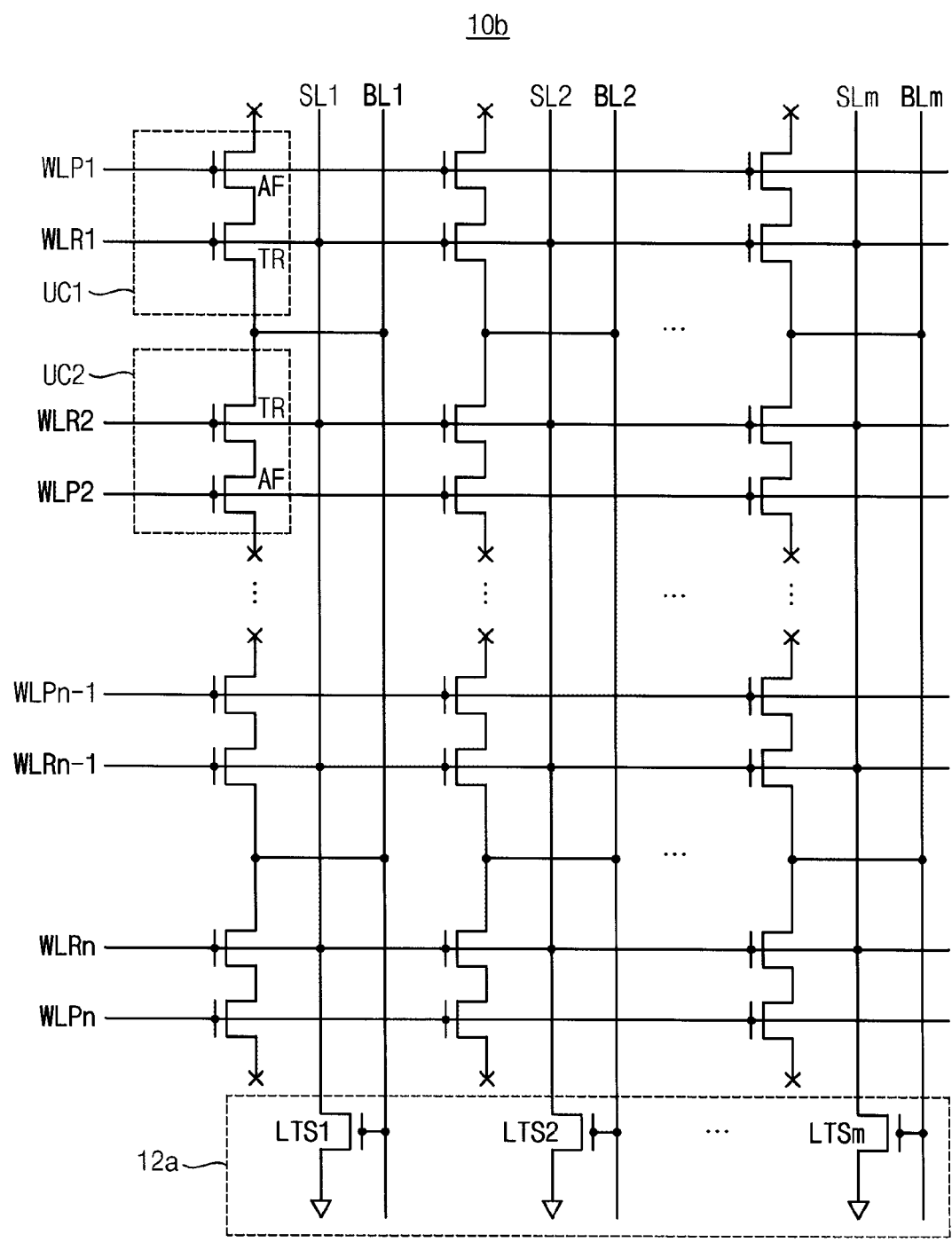
FIG. 11 is a circuit diagram illustrating an OTP memory device according to at least another example embodiment of the inventive concepts.

FIG. 11 is a circuit diagram illustrating an OTP memory device according to at least another example embodiment of the inventive concepts.

FIG. 11 illustrates an OTP memory device 10b in which the switching circuit 12 and the memory cell array 11 in FIG. 1 are formed separately. The switching circuit 12 in FIG. 1 may be implemented with a switching circuit 12a in FIG. 11 that includes a plurality of line switching transistors LTS1~LTSm corresponding to the bitlines BL1~BLm, respectively. Each line switching transistor LTSy (y=1~m) may be connected between read wordlines WLR1~WLRn and a ground voltage, and a gate electrode of each line switching transistor LTSy may be connected to a corresponding bitline BLy.

Referring to FIG. 11, the OTP memory device 10b may include a plurality of OTP memory cells UC1 and UC2 that are connected to a plurality of bitlines BL1~BLm, a plurality of voltage wordlines WLP1~WLPn and a plurality of read wordlines WLR1~WLRn, respectively, and arranged in an n*m matrix.

The gate electrode of the read transistor TR may be connected to the corresponding read wordline WLRx (x=1~n) and the source electrode of the read transistor TR may be connected to the corresponding bitline BLy (y=1~m).

The first electrode of the antifuse AF may be connected to the corresponding wordline WLPx and the second electrode of the antifuse AF may be connected to the drain electrode of the read transistor TR.

Each line switching transistor LTSy may be connected between the read wordlines WLR1~WLRn and the ground voltage, and the gate electrode of the line switching transistor LTSy may be connected to the corresponding bitline BLy. The line switching transistor LTSy may, in the program mode, detect the program state of the antifuse AF to block the current from flowing through the antifuse AF from the corresponding voltage wordline WLPx to the corresponding bitline BLy based on the detected program state.

As described above, the antifuse AF may be a MOS transistor. The gate electrode or the first electrode of the MOS transistor AF may be connected to the corresponding voltage wordline WLPx, the source electrode or the second electrode of the MOS transistor AF may be connected to the drain electrode of the read transistor TR and the drain electrode of the MOS transistor AF may be floated.

Each of the OTP memory cells UC1 and UC2 may include the antifuse AF and the read transistor TR. FIG. 11 illustrates a non-limiting example that two unit cells UC1 and UC2 form a pair and the arrangement of the unit cells may be implemented variously.

As illustrated in FIG. 9, each cell switching transistor CTS may be connected between the gate electrode of the read transistor TR of the corresponding OTP memory cell and the ground voltage, and the gate electrode of each cell switching transistor CTS may be connected to the source electrode of the read transistor TR of the corresponding OTP memory cell.

Hereinafter, a programming operation of the OTP memory cell according to example embodiments is described with reference to FIGS. 3, 4, 5 and 11.

In case of programming a selected memory cell, which is connected to a selected voltage wordline WLP1, a selected read wordline WLR1 and a selected bitline BL1, a program voltage VPGM, which is a relatively high voltage, may be applied to the selected voltage wordline WLP1 and a selection voltage, which is lower than the program voltage VPGM, may be applied to the selected read wordline WLR1. A ground voltage 0V may be applied to non-selected voltage wordlines WLP2, . . . , WLPn and non-selected read wordlines WLR2, . . . , WLRn. The program permission voltage VPER (e.g., the ground voltage 0V) may be applied to the selected bitline BL1, and the program inhibition voltage VINH may be applied to non-selected bit lines BL2, . . . , BLm. For example, the program voltage VPGM may be about 7V, and the selection voltage may be about 3V.

The selection voltage may be applied to the first gate 111 of the read transistor TR through the selected read wordline WLR1, and the ground voltage 0V may be applied to the source region 113 of the read transistor TR through the selected bitline BL1. Therefore, the read transistor TR may be turned on and a voltage of the first drain 114 may be 0V. The program voltage VPGM may be applied to the second gate 121 of the antifuse AF through the selected voltage wordline WLP1, and, as described above, the voltage of the second source region 123 of the antifuse AF, may be the ground voltage 0V. Therefore, intensive electric field may be applied to the second gate insulation layer 122 of the antifuse AF1 to break down an insulating property of the second gate insulation layer 122 so that the selected memory cell is programmed.

When the antifuse AF is programmed, the source region 123 of the antifuse AF, all of the drain region 114 and the source region 113 of the read transistor TR are electrically connected, and thus a considerable leakage current may flow from the corresponding voltage wordline to the corresponding bitline BL1. As described above with reference to FIG. 10, the leakage current may increase the voltage drop along the voltage wordline and disturb the program of the other OTP memory cells connected to the same wordline but connected to the different bitlines.

The non-selected memory cells that are connected to the non-selected voltage wordlines WLP2, . . . , WLPn and the non-selected read wordlines WLR2, . . . , WLRn may not be programmed since the ground voltage 0V is applied to both the non-selected voltage wordlines WLP2, . . . , WLPn and the non-selected read wordlines WLR2 so that intensive electric field is not applied to the second gate insulation layer 122.

The non-selected memory cells that are connected to the selected voltage wordline WLP1, the selected read wordline WLR1 and the non-selected bitlines BL2, . . . , BLm may not be programmed, either.

For example, an operation of the non-selected memory cell, which is connected to the selected voltage wordline WLP1, the selected read wordline WLR1 and the non-selected bit line BL2 may be described. The selection voltage may be applied to the selected read wordline WLR1 and the program inhibition voltage VINH may be applied to the non-selected bitline BL2. A voltage difference between the first gate 111 of the read transistor TR and the first source region 113 of the read transistor TR may be zero so that the read transistor TR is turned off and the first drain region 114 of the read transistor TR is floated. Even though the program voltage VPGM is applied to the second gate 121 of the antifuse AF through the selected voltage wordline WLP1, an intensive electric field may not be applied to the second gate insulation layer 122 of the antifuse AF because the second source region 123 of the antifuse AF is floated.

According to at least some example embodiments of the inventive concepts, the switching transistor TS, that is, the line switching transistors LTS1~LTSm may detect the programmed states of the OTP memory cells in the program mode and may block the currents from flowing through the programmed OTP memory cells from the voltage wordlines to the bitlines.

When the antifuse AF is programmed, a high voltage corresponding to the program voltage VPGM is applied to the third gate 131 of the switching transistor TS. As described above, the program voltage VPGM may be set to be higher than the threshold voltage VTH of the switching transistor TS. The switching transistor TS may be turned on and the first gate of the read transistor TR may be connected to the ground voltage VSS. As a result, the read transistor TR may be turned off to block the current flowing through the programmed antifuse AF from the voltage wordline WLP to the bitline BL.

As such, the OTP memory cell and the OTP memory device may reduce the voltage drop on the voltage word line using the switching circuit to block the leakage current from flowing through the program-completed antifuse and thus may efficiently perform the multi-bit program of programming multiple bits simultaneously.

Figure 12:
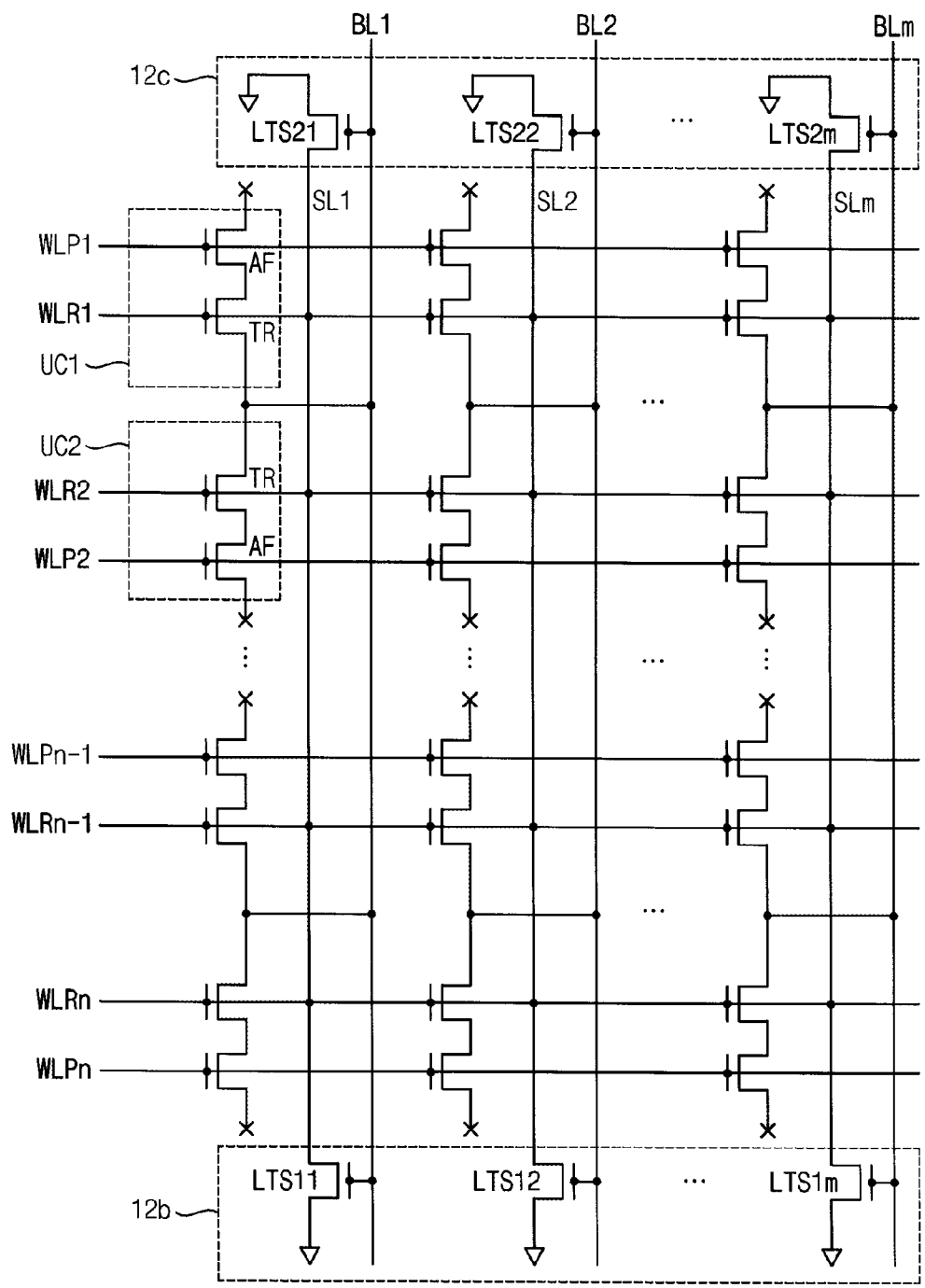
FIG. 12 is a circuit diagram illustrating an OTP memory device according to at least another example embodiment of the inventive concepts.

FIG. 12 is a circuit diagram illustrating an OTP memory device according to at least another example embodiment of the inventive concepts.

Compared with the OTP memory device 10b of FIG. 11 including the one switching circuit 12a, an OTP memory device 10c of FIG. 12 includes two switching circuits 12b and 12c disposed in bottom and top portions of the memory cell array. The configuration and operation of the OTP memory device 10c of FIG. 12 are similar to those of the OTP memory device 10b of FIG. 11 and thus repeated descriptions are omitted.

FIG. 12 illustrates an OTP memory device 10c in which the switching circuit 12 and the memory cell array 11 in FIG. 1 are formed separately. The switching circuit 12 in FIG. 1 may be implemented with switching circuits 12b and 12c in FIG. 12 that includes a plurality of line switching transistors LTS11~LTS1m and LTS21~LTS2m corresponding to the bitlines BL1~BLm, respectively.

Each line switching transistor LTS1y or LTS2y (y=1~m) may be connected between read wordlines WLR1~WLRn and a ground voltage, and a gate electrode of each line switching transistor LTSy may be connected to a corresponding bitline BLy. The line switching transistor LTS1y or LTS2y may, in the program mode, detect the program state of the antifuse AF to block the current from flowing through the antifuse AF from the corresponding voltage wordline WLPx to the corresponding bitline BLy based on the detected program state.

When the antifuse AF is programmed, a high voltage corresponding to the program voltage VPGM is applied to the third gate 131 of the switching transistor TS. As described above, the program voltage VPGM may be set to be higher than the threshold voltage VTH of the switching transistor TS. The switching transistor TS may be turned on and the first gate of the read transistor TR may be connected to the ground voltage VSS. As a result, the read transistor TR may be turned off to block the current flowing through the programmed antifuse AF from the voltage wordline WLP to the bitline BL.

As such, the OTP memory cell and the OTP memory device may reduce the voltage drop on the voltage word line using the switching circuit to block the leakage current from flowing through the program-completed antifuse and thus may efficiently perform the multi-bit program of programming multiple bits simultaneously.

FIGS. 11 and 12 illustrate non-limiting embodiments that the switching circuits 12a, 12b and 12c including the line switching transistors are disposed in the bottom portion and in the top portion of the memory cell array, but the number and disposition of the switching circuits including the line switching transistors may be changed variously.

Figure 13:
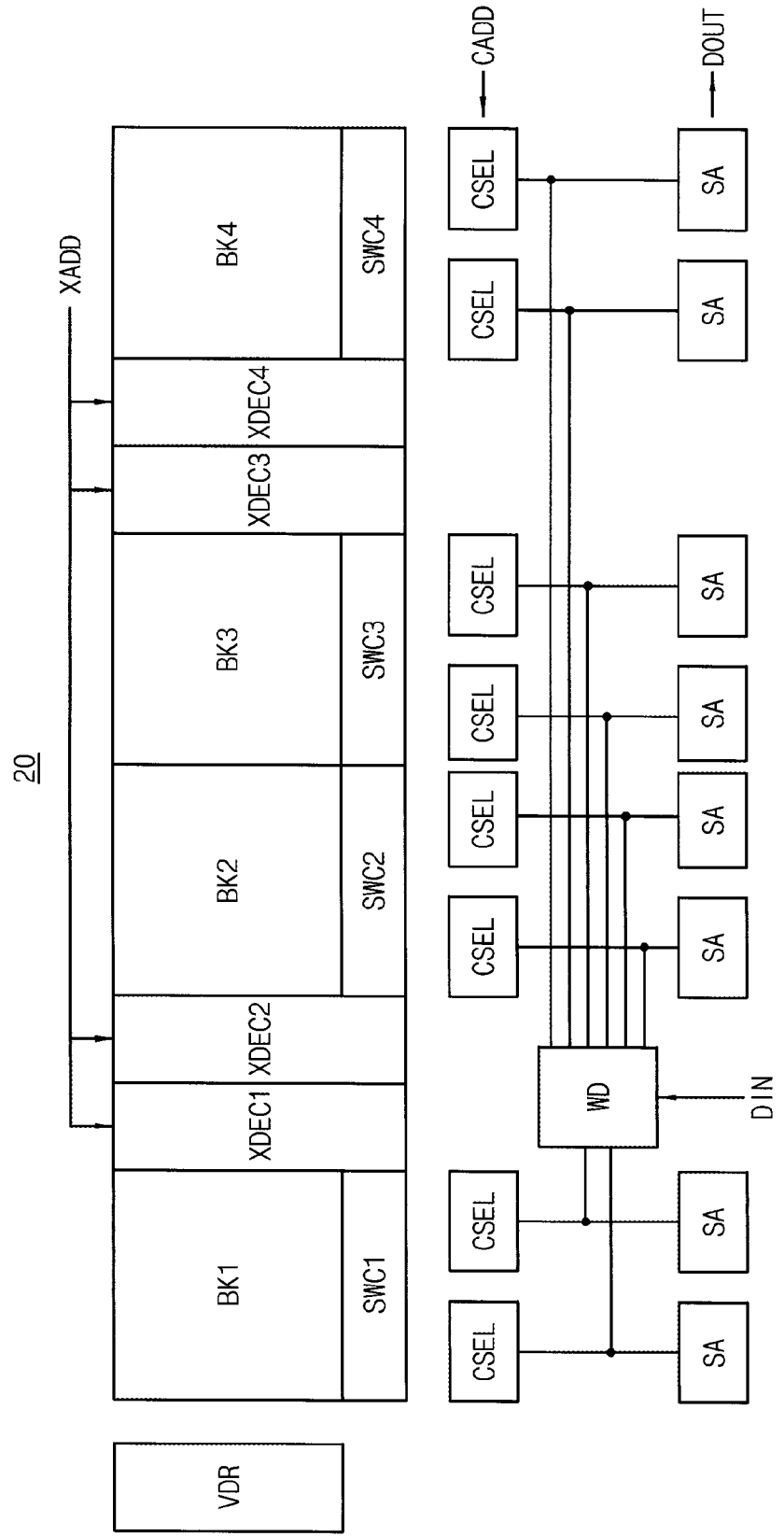
FIG. 13 is a block diagram illustrating an OTP memory device according to at least some example embodiments of the inventive concepts.

FIG. 13 is a block diagram illustrating an OTP memory device according to at least some example embodiments of the inventive concepts.

Referring to FIG. 13, an OTP memory device 20 may include a memory cell array BK1~BK4, switching circuits SWC1~SWC4, row selection circuits XDEC1~XDEC4 and VDR, column selection circuits CSEL and read-write circuits SA and WD.

The memory cell array BK1~BK4 may include a plurality of OTP memory cells that are coupled to a plurality of bitlines BL and a plurality of wordlines WL, respectively. As described above, the wordlines WL may include voltage wordlines WLP and read wordlines WLR. The OTP memory cells in the memory cell array may form a plurality of memory banks BK1~BK4. FIG. 13 illustrates four memory banks BK1~BK4 for convenience of illustration, but the number of the memory banks may be changed variously.

The switching circuits SWC1~SWC4 may correspond to the memory banks BK1~BK4, respectively. The switching circuits SWC1~SWC4 may, in a program mode, detect program states of the OTP memory cells to block currents from flowing through the OTP memory cells from the voltage wordlines WLP to the bitlines BL based on the detected program states.

According to at least some example embodiments of the inventive concepts, as described below with reference to FIG. 9, each of the switching circuits SWC1~SWC4 may be inseparably formed with each of the memory banks BK1~BK4. For example, each of the switching circuits SWC1~SWC4 may include a plurality of cell switching transistors CTS corresponding to the OTP memory cells, respectively. Each cell switching transistor CTS may be connected between a gate electrode of a read transistor TR of the corresponding OTP memory cell and a ground voltage and a gate electrode of each cell switching transistor may be connected to a source electrode of the read transistor TR of the corresponding OTP memory cell.

According to at least some other example embodiments of the inventive concepts, as described below with reference to FIGS. 11 and 12, each of the switching circuits SWC1~SWC4 may be formed separably from each of the memory banks BK1~BK4. For example, each of the switching circuits SWC1~SWC4 may include a plurality of line switching transistors LTS corresponding to the bitlines BL, respectively. Each line switching transistor LTS may be connected between the read wordlines WLR and a ground voltage and a gate electrode of each line switching transistor LTS may be connected to the corresponding bitline BL.

The row selection circuits XDEC1~XDEC4 and VDR may include row decoders XDEC1~XDEC4 for selecting a wordline WL corresponding to a row address and a voltage driver VDR for providing voltages applied to the wordlines WL. The voltages may include the program voltage VPGM, the read voltage VRD, etc. as described with reference to FIG. 3.

The column selection circuit CSEL may include a column gate circuit and a column decoder for selecting a bitline corresponding to a column address. The column decoder may generate column selection signals based on the column address and a column selection enable signal. The column gate circuit may include a plurality of switches that are turned on selectively in response to the column selection signals. The one switch corresponding to the column address may be turned on to select the bitline BL.

The read-write circuits SA and WD may be connected to the bitlines BL via the column selection circuit CSEL. The read-write circuit SA and WD may include a read sense amplifier SA and a write driver WD. The read sense amplifier SA may perform a read operation for sensing the data stored in the OTP memory cells and providing the read data. The write driver WD may perform a write operation for storing the write data into the OTP memory cells. The write driver WD and the read sense amplifier SA may be formed inseparably or separably.

The OTP memory device 20 may program a plurality of bits, that is, a plurality of OTP memory cells in the memory banks BK1~BK4 simultaneously in the program mode. According to at least some example embodiments of the inventive concepts, the OTP memory device 20 may select and enable one of the memory banks BK1~BK4 and program a plurality of OTP memory cells of a selected row in the selected memory bank simultaneously. According to at least some other example embodiments of the inventive concepts, the OTP memory device 20 may select and enable two or more memory banks of the memory banks BK1~BK4 and program a plurality of OTP memory cells of a selected row in the selected memory banks simultaneously. In still other example embodiments, the OTP memory device 20 may enable all of the memory banks BK1~BK4 and program OTP memory cells corresponding to the number of the memory banks BK1~BK4, that is, one OTP memory cell per memory bank, simultaneously.

The OTP memory device 20 may reduce the voltage drop on the voltage word line using the switching circuits SWC1~SWC2 to block the leakage current from flowing through the program-completed antifuse and thus efficiently perform the multi-bit program of programming multiple bits simultaneously.

Figure 14:
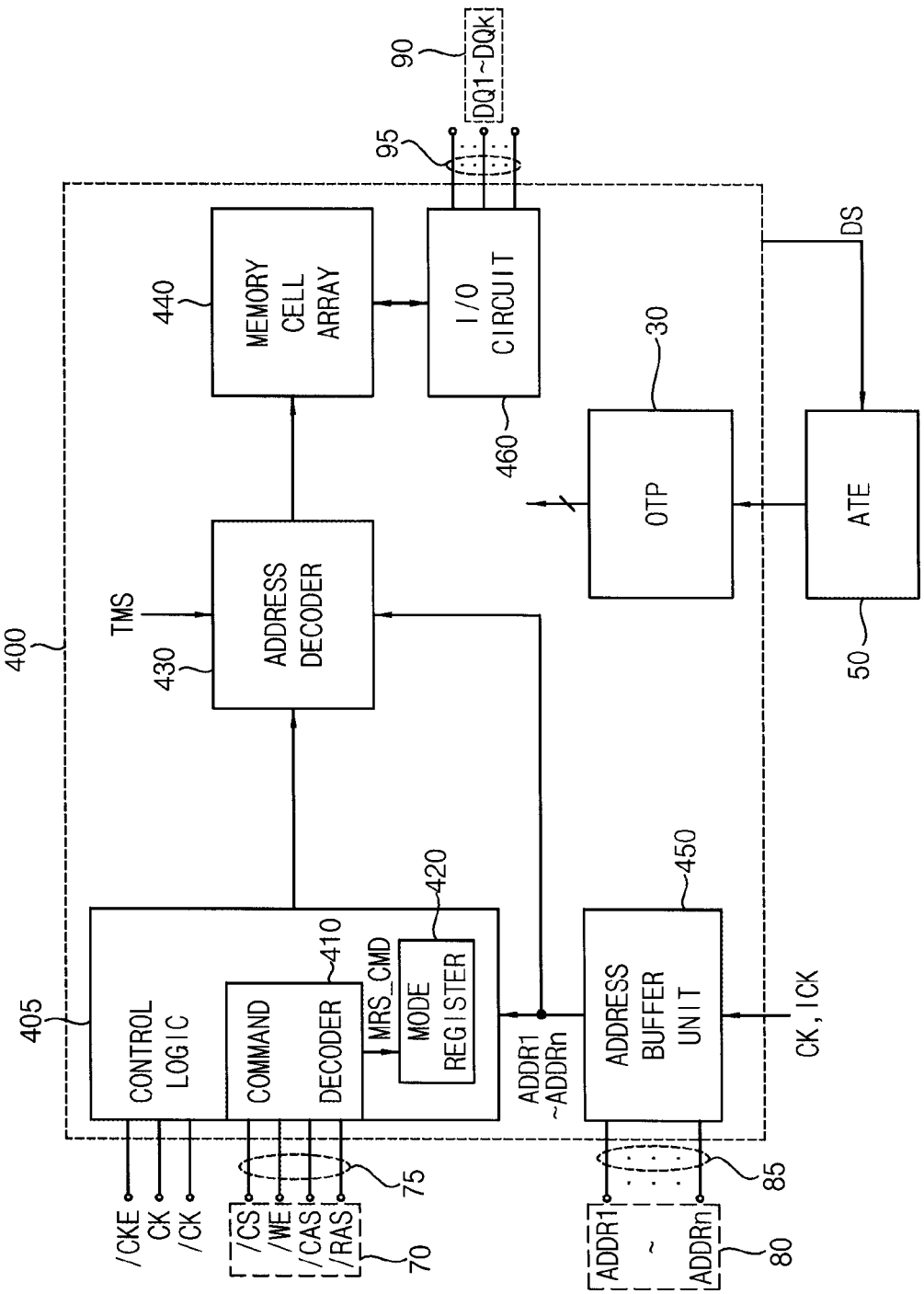
FIG. 14 is a block diagram illustrating a memory device including an OTP memory according to at least some example embodiments of the inventive concepts.

FIG. 14 is a block diagram illustrating a memory device including an OTP memory according to at least some example embodiments of the inventive concepts.

Referring to FIG. 14, a memory device 400 may include control logic 405, an address decoder 430, a memory cell array 440, an address buffer unit 450, an input/output (I/O) unit 460 and an OTP memory 30.

The control logic 505 receives control signals 70 through command pins 75, receives an address signal 80 through address pins 85, and controls the address decoder 430 which accesses the memory cell array 440 based on commands and the address signal. The control signals 70 include a chip selection signal/CS, write enable signal /WE, column address strobe signal /CAS, and row address strobe signal/ RAS. The address signal 30 includes ADDR1~ADDRn. The combination of the control signals /CS, /WE, /CAS, and /RAS designate the command. In addition, in some embodiments, the control logic 405 may also receive a clock enable signal /CKE, a clock signal CK, and an inverted clock signal /CK.

The address buffer unit 450 receives the address signal 80 through the address pins 85, and provides the address signal ADDR1~ADDRn to the control logic 405 and the address decoder 430 in synchronization with the clock signal CK or the inverted clock signal /CK.

The I/O unit 460 provides data 90 to the memory cell array 440 or receives the data 90 from the memory cell array 440 through the data pins 95. The data 90 includes DQ1~DQk.

The control logic 405 includes a command decoder 410 and a mode register 420. The command decoder 410 decodes the command designated by the control signals /CS, /WE, /CAS, and /RAS to provide a mode register set (MRS) command MRS_CMD to the mode register 420. The mode register 420 sets an operation mode of the semiconductor memory device 60 in response to the MRS command MRS_CMD. The operation mode of the semiconductor memory device 60 may include a test mode, MRS mode, TMRS mode and a normal operation mode.

The OTP memory 30 may include a switching circuit as described with reference to FIGS. 1 through 13. In a test mode, an external tester ATE 50 may program required data in the OTP memory 30. The programmed data in the OTP memory 30 may be used to control the operation of the memory device 400. As described above, the voltage drop on the voltage word line may be reduced using the switching circuit to block the leakage current from flowing through the program-completed antifuse and to efficiently perform the multi-bit program of programming multiple bits simultaneously.

Figure 15:
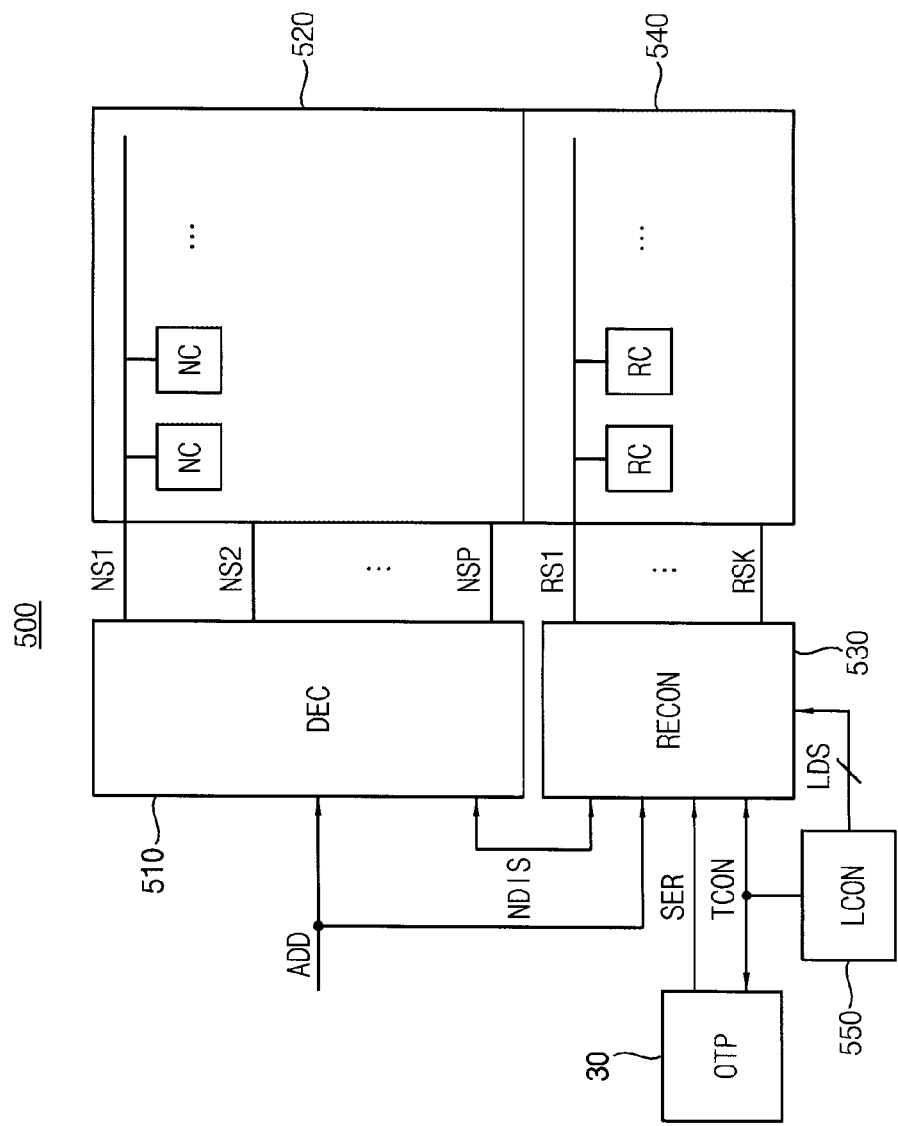
FIG. 15 is a block diagram illustrating a memory device performing a repair operation using an OTP memory according to at least some example embodiments of the inventive concepts.

FIG. 15 is a block diagram illustrating a memory device performing a repair operation using an OTP memory according to at least some example embodiments of the inventive concepts.

Referring to FIG. 15, a memory device 500 may include a decoder (DEC) 510, a memory cell array 520 and 540, an OTP memory 30, a repair control circuit (RECON) 530 and a load controller (LCON) 550. In FIG. 15, components unrelated with descriptions of the repair operation using the OTP memory 30 are omitted.

The memory cell array 520 and 540 may be divided into the normal memory cell array 520 and the redundancy memory cell array 540. The normal cell array 520 includes a plurality of normal memory cells NCs coupled to normal selection lines NS1 through NSP and the redundancy memory cell array 540 includes a plurality of redundancy memory cells RCs coupled to redundancy selection lines RS1 through RSK.

The decoder 510 selects one of the normal selection lines NS1 through NSP based on an address ADD for a read operation or a write operation. By selecting the normal selection line, the read operation or the write operation may be performed with respect to the normal memory cells coupled to the selected one of the normal selection lines NS1 through NSP.

The OTP memory 30 stores fail addresses indicating locations of fail memory cells among the normal memory cells NCs, and outputs a serial signal SER based on the stored fail addresses when the power of the memory device 500 is on. The fail addresses may be obtained and stored in the OTP memory 30 through test processes of the memory device 500. The load controller 550 generates loading control signals LDS and TCON to control the loading of the fail addresses from the OTP memory to the repair control circuit 530.

The repair control circuit 530 stores or loads the fail addresses sequentially based on the serial signal SER and the loading control signals LDS and TCON. The repair control circuit 530 controls a repair operation for replacing an access to the normal memory cells NCs with an access to the redundancy memory cells RCs when the input address ADD is identical to one of the stored fail addresses. The repair control circuit 530 may select one of the redundancy selection lines RS1 through RSK with disabling the decoder 510 by activating a disable signal NDIS, when the input address ADD is identical to one of the stored fail addresses.

According to at least one example embodiment of the inventive concepts, the normal selection lines NS1 through NSP and the redundancy selection lines RS1 through RSK may be wordlines. In this case, the repair control circuit 530 may perform the repair operation wordline by wordline. If each wordline stores a plurality of pages, the repair control circuit 530 may perform the repair operation page by page. In at least another example embodiment of the inventive concepts, the normal selection lines NS1 through NSP and the redundancy selection lines RS1 through RSK may be bitlines. In this case, the repair control circuit 530 may perform the repair operation bitline by bitline.

Figure 16:
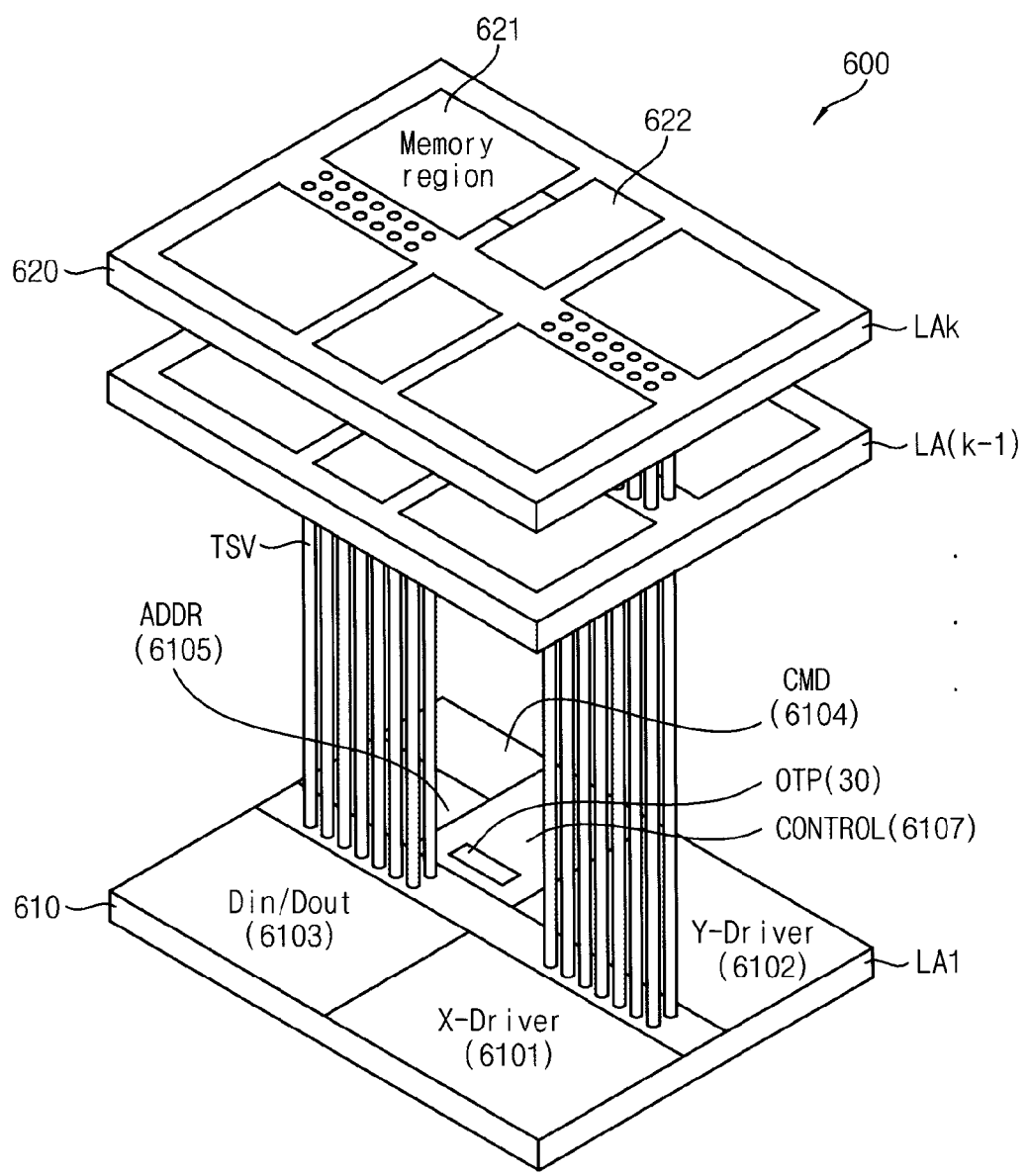
FIG. 16 is a structural diagram illustrating a semiconductor memory device according to at least some example embodiments of the inventive concepts.

FIG. 16 is a structural diagram illustrating a semiconductor memory device according to at least some example embodiments of the inventive concepts.

Referring to FIG. 16, a semiconductor memory device 600 may include first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals between the layers by through-substrate vias (e.g., through-silicon vias TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the kth semiconductor integrated circuit layer LAk or 620 as the slave chip.

The first semiconductor integrated circuit layer 610 may include various peripheral circuits for driving memory regions 621 provided in the kth semiconductor integrated circuit layer 620. For example, the first semiconductor integrated circuit layer 610 may include a row (X)-driver 6101 for driving wordlines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of sub-arrays, and each of the sub-arrays may include a plurality of dynamic memory cells.

The first semiconductor integrated circuit layer 610 may further include a control circuit 6107. The control circuit 6107 may control an access to the memory region 621 based on a command and an address signal from a memory controller and may generate control signals for accessing the memory region 621.

The first semiconductor integrated circuit layer 610 may further include an OTP memory 30 according to at least some example embodiments of the inventive concepts. The OTP memory 30 includes a switching circuit as described with reference to FIGS. 1 through 13. The voltage drop on the voltage word line may be reduced using the switching circuit to block the leakage current from flowing through the program-completed antifuse and to efficiently perform the multi-bit program of programming multiple bits simultaneously.

Figure 17:
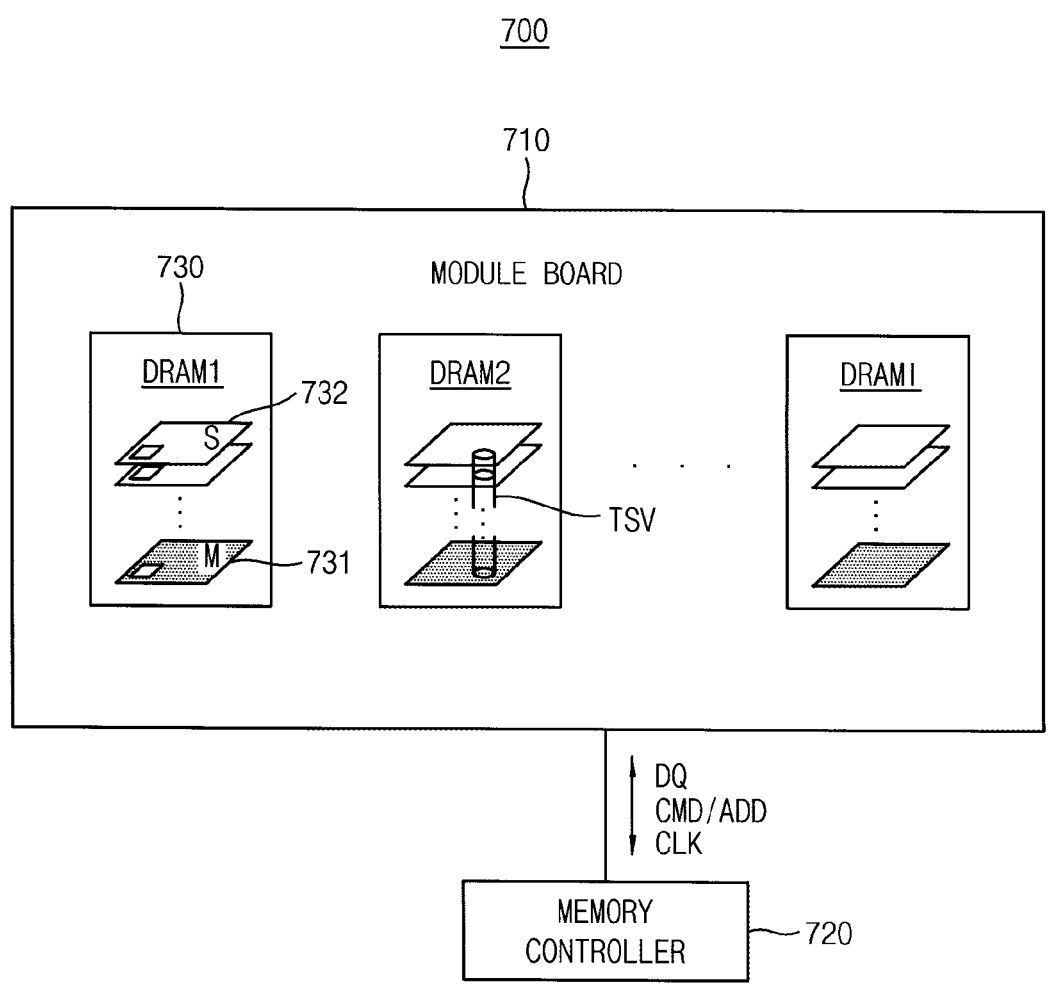
FIG. 17 is a block diagram illustrating a memory system according to at least some example embodiments of the inventive concepts.

FIG. 17 is a block diagram illustrating a memory system according to at least some example embodiments of the inventive concepts.

Referring to FIG. 17, a memory system 700 may include a memory module 710 and a memory controller 720. The memory module 710 may include at least one semiconductor memory device 730 mounted on a module board. For example, the semiconductor memory device 730 may be constructed as a DRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-substrate vias (e.g., through-silicon vias TSV).

As described with reference to FIG. 16, the master chip 731 may include an OTP memory according to at least some example embodiments of the inventive concepts. The OTP memory includes a switching circuit as described with reference to FIGS. 1 through 13. The voltage drop on the voltage word line may be reduced using the switching circuit to block the leakage current from flowing through the program-completed antifuse and to efficiently perform the multi-bit program of programming multiple bits simultaneously.

The memory module 710 may communicate with the memory controller 720 via a system bus. Data DQ, a command/address CMD/ADD, and a clock signal CLK may be transmitted and received between the memory module 710 and the memory controller 720 via the system bus.

Figure 18:
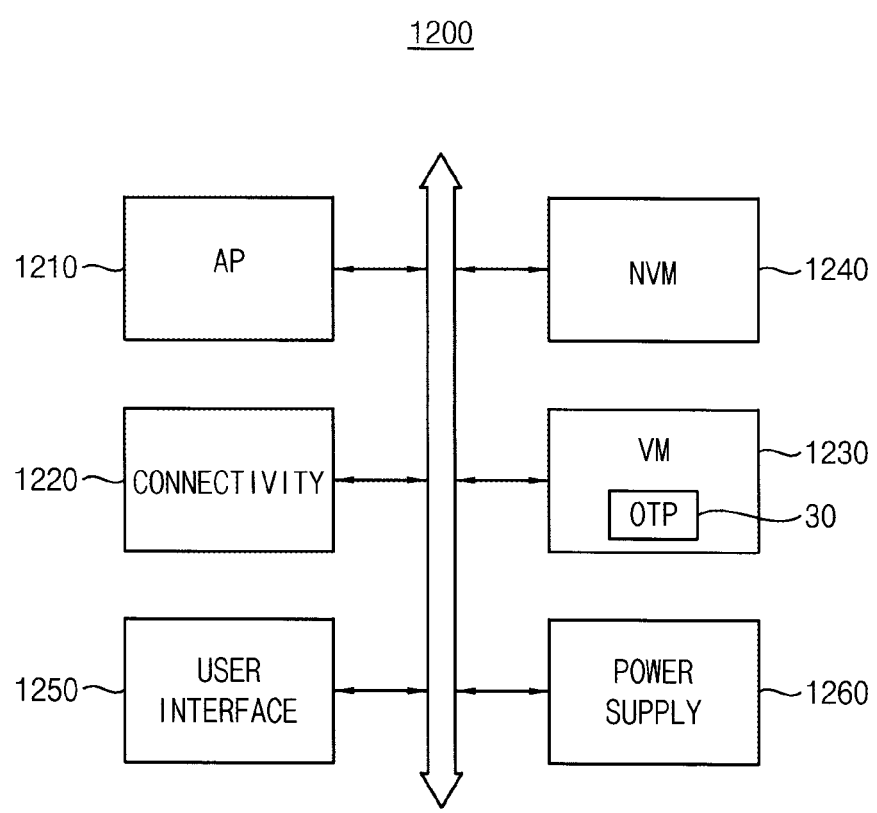
FIG. 18 is a block diagram illustrating a mobile system according to at least some example embodiments of the inventive concepts.

FIG. 18 is a block diagram illustrating a mobile system according to at least some example embodiments of the inventive concepts.

Referring to FIG. 18, a mobile system 1200 includes an application processor 1210, a connectivity unit 1220, a volatile memory device (VM) 1230, a nonvolatile memory device 1240, a user interface 1250, and a power supply 1260. In some embodiments, the mobile system 1200 may be a mobile phone, a smart phone, a personal digital assistant (PDA), a portable multimedia player (PMP), a digital camera, a music player, a portable game console, a navigation system, or another type of electronic device.

The application processor 1210 may execute applications such as a web browser, a game application, a video player, etc. In some embodiments, the application processor 1210 may include a single core or multiple cores. For example, the application processor 1210 may be a multi-core processor such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some embodiments, connectivity unit 1220 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc. The volatile memory device 1230 may include an OTP memory according to at least some example embodiments of the inventive concepts. The OTP memory includes a switching circuit as described with reference to FIGS. 1 through 13. The voltage drop on the voltage word line may be reduced using the switching circuit to block the leakage current from flowing through the program-completed antifuse and to efficiently perform the multi-bit program of programming multiple bits simultaneously.

The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

In some embodiments, the mobile system 1200 and/or components of the mobile system 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multichip package (MCP), wafer-level fabricated package (WFP), wafer-level processed stack package (WSP), etc.

Figure 19:
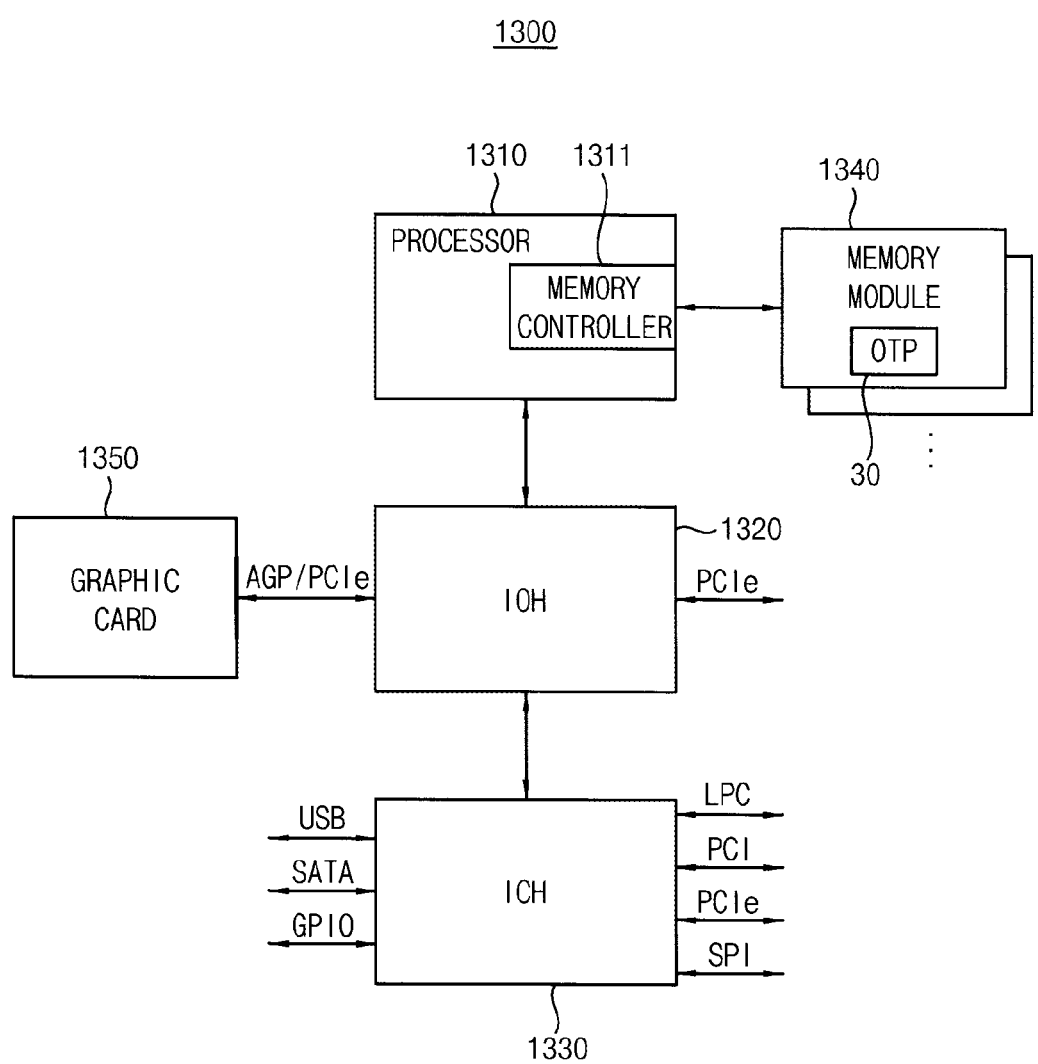
FIG. 19 is a block diagram illustrating a computing system according to at least some example embodiments of the inventive concepts.

FIG. 19 is a block diagram illustrating a computing system according to at least some example embodiments of the inventive concepts.

Referring to FIG. 19, a computing system 1300 includes a processor 1310, an input/output hub (IOH) 1320, an input/output controller hub (ICH) 1330, at least one memory module 1340, and a graphics card 1350. In some embodiments, the computing system 1300 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1310 may perform various computing functions such as executing specific software for performing specific calculations or tasks. For example, the processor 1310 may be a microprocessor, a central process unit (CPU), a digital signal processor, or the like. In some embodiments, the processor 1310 may include a single core or multiple cores. For example, the processor 1310 may be a multi-core processor, such as a dual-core processor, a quad-core processor, a hexa-core processor, etc. Although FIG. 40 illustrates the computing system 1300 including one processor 1310, in some embodiments, the computing system 1300 may include a plurality of processors. The processor 1310 may include an internal or external cache memory.

The processor 1310 may include a memory controller 1311 for controlling operations of the memory module 1340. The memory controller 1311 included in the processor 1310 may be referred to as an integrated memory controller (IMC). A memory interface between the memory controller 1311 and the memory module 1340 may be implemented with a single channel including a plurality of signal lines, or may bay be implemented with multiple channels, to each of which at least one memory module 1340 may be coupled. In some embodiments, the memory controller 1311 may be located inside the input/output hub 1320, which may be referred to as memory controller hub (MCH).

The memory module 1340 may include a plurality of memory devices that store data provided from the memory controller 1311. The memory module 1340 may include an OTP memory according to at least some example embodiments of the inventive concepts. The OTP memory includes a switching circuit as described with reference to FIGS. 1 through 13. The voltage drop on the voltage word line may be reduced using the switching circuit to block the leakage current from flowing through the program-completed antifuse and to efficiently perform the multi-bit program of programming multiple bits simultaneously.

The input/output hub 1320 may manage data transfer between processor 1310 and devices, such as the graphics card 1350. The input/output hub 1320 may be coupled to the processor 1310 via various interfaces. For example, the interface between the processor 1310 and the input/output hub 1320 may be a front side bus (FSB), a system bus, a HyperTransport, a lightning data transport (LDT), a QuickPath interconnect (QPI), a common system interface (CSI), etc. Although FIG. 19 illustrates the computing system 1300 including one input/output hub 1320, in some embodiments, the computing system 1300 may include a plurality of input/output hubs. The input/output hub 1320 may provide various interfaces with the devices. For example, the input/output hub 1320 may provide an accelerated graphics port (AGP) interface, a peripheral component interface-express (PCIe), a communications streaming architecture (CSA) interface, etc.

The graphic card 1350 may be coupled to the input/output hub 1320 via AGP or PCIe. The graphics card 1350 may control a display device (not shown) for displaying an image. The graphics card 1350 may include an internal processor for processing image data and an internal memory device. In some embodiments, the input/output hub 1320 may include an internal graphics device along with or instead of the graphics card 1350 outside the graphics card 1350. The graphics device included in the input/output hub 1320 may be referred to as integrated graphics. Further, the input/output hub 1320 including the internal memory controller and the internal graphics device may be referred to as a graphics and memory controller hub (GMCH).

The input/output controller hub 1330 may perform data buffering and interface arbitration to efficiently operate various system interfaces. The input/output controller hub 1330 may be coupled to the input/output hub 1320 via an internal bus, such as a direct media interface (DMI), a hub interface, an enterprise Southbridge interface (ESI), PCIe, etc. The input/output controller hub 1330 may provide various interfaces with peripheral devices. For example, the input/output controller hub 1330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1310, the input/output hub 1320 and the input/output controller hub 1330 may be implemented as separate chipsets or separate integrated units. In other embodiments, at least two of the processor 1310, the input/output hub 1320 and the input/output controller hub 1330 may be implemented as a single chipset. Also, while many features of the embodiments are disclosed as units, in other embodiments those features may be implemented as other forms of logic including but not limited to code-based operations performed by a processor.

As such, the OTP memory cell and the OTP memory device according to example embodiments may reduce the voltage drop on the voltage word line using the switching circuit to block the leakage current flowing through the program-completed antifuse and thus may efficiently perform the multi-bit program of programming multiple bits simultaneously.

The present disclosure may be applied to arbitrary devices and systems including a memory chip. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A one-time programmable (OTP) memory device comprising:
   a memory cell array including a plurality of OTP memory cells,
   each OTP memory cell being connected to a corresponding bitline of a plurality of bitlines, a corresponding voltage wordline of a plurality of voltage wordlines and a corresponding read wordline of a plurality of read wordlines; and
   a switching circuit configured to, in a program mode, detect program states of the plurality of OTP memory cells to block currents from flowing through the plurality of OTP memory cells from the voltage wordlines to the bitlines based on the detected program states.

2. The OTP memory device of claim 1, wherein each OTP memory cell includes:
   an antifuse connected between an intermediate node and the corresponding voltage wordline; and
   a read transistor connected between the intermediate node and the corresponding bitline, a gate electrode of the read transistor connected to the corresponding read wordline.

3. The OTP memory device of claim 2, wherein the switching circuit includes a plurality of cell switching transistors corresponding to the OTP memory cells, respectively, and
   wherein,
      each cell switching transistor is connected between the gate electrode of the read transistor of the corresponding OTP memory cell and a ground voltage, and
      a gate electrode of each cell switching transistor is connected to a source electrode of the read transistor of the corresponding OTP memory cell.

4. The OTP memory device of claim 3, wherein,
   the OTP memory device is configured to turn on the read transistor to program the antifuse in the program mode, and
   the OTP memory device is configured to turn on the cell switching transistor in order to turn off the read transistor after the antifuse is programmed and to block a current from flowing through the programmed antifuse from the corresponding voltage wordline to the corresponding bitline.

5. The OTP memory device of claim 3, wherein the OTP memory device is configured such that,
   a program voltage is applied to the voltage wordlines in the program mode, and
   a read voltage lower than the program voltage is applied to the voltage wordlines in a read mode.

6. The OTP memory device of claim 5, wherein the OTP memory device is configured to set the program voltage to be higher than a threshold voltage of the cell switching transistor.

7. The OTP memory device of claim 5, wherein the OTP memory device is configured to set the read voltage is set to be lower than a threshold voltage of the cell switching transistor.

8. The OTP memory device of claim 3, wherein the OTP memory device is configured such that, in the program mode, a program permission voltage is applied to the bitlines connected to the OTP memory cells to be programmed, and a program inhibition voltage higher than the program permission voltage is applied to the bitlines connected to the OTP memory cells not to be programmed.

9. The OTP memory device of claim 8, wherein the OTP memory device is configured to set the program inhibition voltage is set to be lower than a threshold voltage of the cell switching transistor.

10. The OTP memory device of claim 2, wherein,
    the switching circuit includes a plurality of line switching transistors corresponding to the plurality of bitlines, respectively,
    each line switching transistor is connected between the read wordlines and a ground voltage, and
    a gate electrode of each line switching transistor is connected to the corresponding bitline.

11. The OTP memory device of claim 10, wherein the two or more line switching transistors are connected to the plurality of bitlines, respectively.

12. The OTP memory device of claim 2, wherein the antifuse includes a metal oxide semiconductor (MOS) transistor.

13. The OTP memory device of claim 12, wherein a drain electrode of the MOS transistor is floated, a source electrode of the MOS transistor is connected to the intermediate node and a gate electrode of the MOS transistor is connected to the corresponding voltage wordline.

14. The OTP memory device of claim 12, wherein,
    a drain electrode and a source electrode of the MOS transistor are connected to the intermediate node, and
    a gate electrode of the MOS transistor is connected to the corresponding voltage wordline.

15. A one-time programmable (OTP) memory device comprising:
    a memory cell array including a plurality of OTP memory cells, each OTP memory cell being connected to a corresponding bitline of a plurality of bitlines, a corresponding voltage wordline of a plurality of voltage wordlines and a corresponding read wordline of a plurality of read wordlines, the OTP memory cells being divided into a plurality of memory banks; and
    a plurality of bank switching circuits corresponding to the plurality of memory banks, respectively, the plurality of bank switching circuits configured to, in a program mode, detect program states of the OTP memory cells to block currents from flowing through the OTP memory cells from the voltage wordlines to the bitlines based on the detected program states.

16. The OTP memory device of claim 15, wherein each OTP memory cell includes:
    an antifuse connected between the corresponding voltage wordline and an intermediate node; and
    a read transistor connected between the intermediate node and the corresponding bitline, a gate electrode of the read transistor connected to the corresponding read wordline.

17. The OTP memory device of claim 16, wherein,
    the bank switching circuits include a plurality of cell switching transistors corresponding to the OTP memory cells, respectively,
    each cell switching transistor of the plurality of cell switching transistors is connected between the gate electrode of the read transistor of the corresponding OTP memory cell and a ground voltage, and
    a gate electrode of each cell switching transistor is connected to a source electrode of the read transistor of the corresponding OTP memory cell.

18. The OTP memory device of claim 16, wherein,
    the bank switching circuits include a plurality of line switching transistors corresponding to the bitlines, respectively, each line switching transistor is connected between the read wordlines and a ground voltage, and a gate electrode of each line switching transistor is connected to the corresponding bitline.

19. The OTP memory device of claim 15, wherein the OTP memory device is configured to program a plurality of bits in the memory banks simultaneously in the program mode.

20. A one-time programmable (OTP) memory cell comprising:

an antifuse connected between a voltage wordline and an intermediate node such that a first current passes through the antifuse from the voltage wordline to the intermediate node when the antifuse is programmed;

a read transistor connected between the intermediate node and a bitline, the read transistor being configured to pass the first current between the intermediate node and the bitline when the read transistor is turned on, the read transistor being configured to block the first current from passing to the bitline when the read transistor is turned off; and a cell switching transistor connected between a gate electrode of the read transistor and a ground node, a gate electrode of the cell switching transistor being connected to the bit line, the cell switching transistor being configured to turn the read transistor off by passing a second current between the gate electrode of the read transistor and the ground node, when the cell switching transistor detects the first current.

\* \* \* \* \*